(12) United States Patent
Wang et al.

(10) Patent No.: US 11,220,613 B2
(45) Date of Patent: Jan. 11, 2022

(54) ELASTIC CONDUCTOR, DEVICE INCLUDING, AND METHOD OF FORMING THE SAME

(71) Applicant: NANYANG TECHNOLOGICAL UNIVERSITY, Singapore (SG)

(72) Inventors: Jiangxin Wang, Singapore (SG); Pooi See Lee, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 69 days.

(21) Appl. No.: 16/606,611

(22) PCT Filed: Apr. 17, 2018

(86) PCT No.: PCT/SG2018/050188
§ 371 (c)(1),
(2) Date: Oct. 18, 2019

(87) PCT Pub. No.: WO2018/194517
PCT Pub. Date: Oct. 25, 2018

(65) Prior Publication Data
US 2021/0115283 A1  Apr. 22, 2021

(30) Foreign Application Priority Data
Apr. 18, 2017  (SG) .............................. 10201703182T

(51) Int. Cl.
*C09D 11/52* (2014.01)
*B29C 64/106* (2017.01)
(Continued)

(52) U.S. Cl.
CPC ............ *C09D 11/52* (2013.01); *B29C 64/106* (2017.08); *B33Y 70/10* (2020.01); *C09D 11/037* (2013.01);
(Continued)

(58) Field of Classification Search
CPC ...................................................... C09D 11/52
See application file for complete search history.

(56) References Cited

U.S. PATENT DOCUMENTS

| 6,276,214 B1 | 8/2001 | Kimura et al. |
| 9,859,226 B1 | 1/2018 | Campbell et al. |
| (Continued) | | |

FOREIGN PATENT DOCUMENTS

| CN | 106328262 A | 1/2017 |
| WO | 2015/089309 A1 | 6/2015 |
| WO | 2017/035710 A1 | 3/2017 |

OTHER PUBLICATIONS

"DuPont™ Elvax® EVA resins for Adhesives, Sealants and Wax Blends," 2012 (6 pages).
(Continued)

*Primary Examiner* — William D Young
(74) *Attorney, Agent, or Firm* — Seed IP Law Group LLP

(57) ABSTRACT

The present invention relates to an elastic conductor with high conductivity and stable electrical performance under stretching. The elastic conductor comprises a matrix material; a plurality of electrically conductive structures embedded in the matrix; and one or more particles embedded in the matrix, wherein the particles are configured to release an electrically conductive material upon stretching of the elastic conductor. In a preferred embodiment, each of the particles comprises a core of the electrically conducting material, such as liquid eutectic gallium indium alloy, and an outer shell surrounding the core, such as gallium oxide.

18 Claims, 22 Drawing Sheets

(51) Int. Cl.
| | |
|---|---|
| B33Y 70/10 | (2020.01) |
| C09D 11/037 | (2014.01) |
| C09D 11/102 | (2014.01) |
| C09D 11/106 | (2014.01) |
| H01B 1/22 | (2006.01) |
| B33Y 10/00 | (2015.01) |
| B33Y 80/00 | (2015.01) |
| B29K 505/00 | (2006.01) |
| F15B 21/02 | (2006.01) |
| H01L 23/538 | (2006.01) |
| H01L 25/075 | (2006.01) |
| H01L 33/62 | (2010.01) |

(52) U.S. Cl.
CPC .......... *C09D 11/102* (2013.01); *C09D 11/106* (2013.01); *H01B 1/22* (2013.01); *B29K 2505/00* (2013.01); *B29K 2995/0005* (2013.01); *B33Y 10/00* (2014.12); *B33Y 80/00* (2014.12); *F15B 21/02* (2013.01); *H01L 23/5387* (2013.01); *H01L 25/0753* (2013.01); *H01L 33/62* (2013.01)

(56) References Cited

U.S. PATENT DOCUMENTS

| | | | |
|---|---|---|---|
| 2012/0067615 | A1 | 3/2012 | Blaiszik et al. |
| 2015/0129276 | A1* | 5/2015 | Shumaker ................ H01B 3/28 174/69 |
| 2015/0342523 | A1 | 12/2015 | Baik et al. |
| 2016/0317992 | A1* | 11/2016 | Thuo .................. B23K 35/0244 |
| 2017/0169914 | A1* | 6/2017 | Sekitani ............... C09D 115/02 |
| 2018/0258235 | A1* | 9/2018 | Thuo ....................... C08L 83/04 |

OTHER PUBLICATIONS

Ahn et al., "Omnidirectional Printing of Flexible, Stretchable, and Spanning Silver Microelectrodes," *Science* 323(5921):1590-1593, 2009 (5 pages).
Boley et al., "Mechanically Sintered Gallium-Indium Nanoparticles," *Adv. Mater.* 27:2355-2360, 2015.
Chortos et al., "Pursuing prosthetic electronic skin," *Nature Materials* 15:937-952, 2016 (17 pages).
Chun et al., "Highly conductive, printable and stretchable composite films of carbon nanotubes and silver," *Nature Nanotechnology* 5:853-857, 2010.
Follmer et al., "inFORM: Dynamic Physical Affordances and Constraints through Shape and Object Actuation," *Proceedings of the 26th annual ACM symposium on User interface software and technology*, ACM, St. Andrews, Scotland, United Kingdom, 2013, 10 pages.
Frutiger et al., "Capacitive Soft Strain Sensors via Multicore-Shell Fiber Printing," *Adv. Mater.* 27:2440-2446, 2015.
Hu et al., "Stretchable Inorganic-Semiconductor Electronic Systems " *Adv. Mater.* 23:2933-2936, 2011.
Kaltenbrunner et al., "An ultra-lightweight design for imperceptible plastic electronics," *Nature* 499:458-463, 2013 (8 pages).
Keplinger et al., "Stretchable, Transparent, Ionic Conductors," *Science* 341(6149):984-987, 2013 (16 pages).
Kim et al., "Highly stretchable, transparent ionic touch panel," *Science* 353(6300):682-687, 2016 (7 pages).
Kim et al., "Stretchable nanoparticle conductors with self-organized conductive pathways," *Nature* 500:59-63, 2013 (6 pages).
Kim et al., "Waterproof AlInGaP optoelectronics on stretchable substrates with applications in biomedicine and robotics," *Nature Materials* 9:929-937, 2010 (10 pages).
Kong et al., "3D Printed Quantum Dot Light-Emitting Diodes," *Nano Lett.* 14(12):7017-7023, 2014 (7 pages).
Larson et al., "Highly stretchable electroluminescent skin for optical signaling and tactile sensing," *Science* 351(6277):1071-1074, 2016 (5 pages).
Lee et al., "Highly Stretchable and Highly Conductive Metal Electrode by Very Long Metal Nanowire Percolation Network," *Adv. Mater.* 24:3326-3332, 2012.
Lewis, "Direct Ink Writing of 3D Functional Materials," *Adv. Fund. Mater.* 16:2193-2204, 2006.
Liang et al., "A Water-Based Silver-Nanowire Screen-Print Ink for the Fabrication of Stretchable Conductors and Wearable Thin-Film Transistors," *Adv. Mater.* 28:5986-5996, 2016.
Liang et al., "Elastomeric polymer light-emitting devices and displays," *Nature Photonics* 7:817-824, 2013.
Lin et al., "Drawing liquid metal wires at room temperature," *Extreme Mechanics Letters* 7:55-63, 2016.
Liu et al., "Hierarchically buckled sheath-core fibers for superelastic electronics, sensors, and muscles," *Science* 349(6246):400-404, 2015 (6 pages).
Lu et al., "Characterization of Silver Flake Lubricants," *Journal of Thermal Analysis and Calorimetry* 59:729-740, 2000.
Markley et al., "Characterization of Silver Flakes Utilized for Isotropic Conductive Adhesives," *1999 International Symposium on Advances Packaging Materials:* 16-20, 1999, 5 pages.
Matsuhisa et al., "Printable elastic conductors with a high conductivity for electronic textile applications," *Nature Communications* 6(7461):1-11, 2015.
Park et al., "Electromechanical cardioplasty using a wrapped elasto-conductive epicardial mesh," *Sci Transl Med* 8(344):1-11, 2016 (12 pages).
Park et al., "Highly stretchable electric circuits from a composite material of silver nanoparticles and elastomeric fibres," *Nature Nanotechnology* 7:803-809, 2012 (7 pages).
Park et al., "Printed Assemblies of Inorganic Light-Emitting Diodes for Deformable and Semitransparent Displays," *Science* 325(5943):977-981, 2009 (6 pages).
Rogers et al., "Materials and Mechanics for Stretchable Electronics," *Science* 327:1603-1607, 2010 (6 pages).
Sekitani et al., "A Rubberlike Stretchable Active Matrix Using Elastic Conductors," *Science* 321(5895):1468-1472, 2008 (6 pages).
Sekitani et al., "Stretchable active-matrix organic light-emitting diode display using printable elastic conductors," *Nature Materials* 8:494-499, 2009.
Song et al., "Digital cameras with designs inspired by the arthropod eye," Nature 497:95-99 and 1-36, 2013 (41 pages).
Sun et al., "Controlled buckling of semiconductor nanoribbons for stretchable electronics," *nature nanotechnology* 1:201-207, 2006.
Sun et al., "Ionic Skin," *Adv. Mater.* 26:7608-7614, 2014.
Wang et al., "Exttemely Stretchable Electroluminescent Devices with Ionic Conductors," *Adv. Mater.* 28:4490-4496, 2016.
Wang et al., "High-Efficiency Transfer of Percolating Nanowire Film for Stretchable and Transparent Photodetectors," *Nanoscale* 6(18):1-6, 2014 (7 pages).
Wang et al., "Printable Superelastic Conductors with Extreme Stretchability and Robust Cycling Endurance Enabled by Liquid-Metal Particles," *Adv. Mater.* 30:1706157, 2018 (7 pages).
White et al., "Ultrathin, highly flexible and stretchable PLEDs," *Nature Photonics* 7:811-816, 2013.
Xu et al., "Highly Conductive and Stretchable Silver Nanowire Conductors," *Adv. Mater.* 24:5117-5122, 2012 (9 pages).
Yan et al., "An Intrinsically Stretchable Nanowire Photodetector with a Fully Embedded Structure," *Adv. Mater.* 26:943-950, 2014.
Yang et al., "Electroluminescence of Giant Stretchability," *Adv. Mater.* 28:4480-4484, 2016.
Yu et al., "Highly Flexible Silver Nanowire Electrodes for Shape-Memory Polymer Light-Emitting Diodes," *Adv. Mater.* 23:664-668, 2011.
Zhang et al., "Polymer-Embedded Carbon Nanotube Ribbons for Stretchable Conductors," *Adv. Mater.* 22:3027-3031, 2010.
Zhu et al., "Ultrastretchable Fibers with Metallic Conductivity Using a Liquid Metal Alloy Core," *Adv. Funct. Mater.* 23:2308-2314, 2013.

(56) References Cited

OTHER PUBLICATIONS

Extended European Search Report for European Application No. 18787374.0, dated Dec. 17, 2020, 7 pages.

* cited by examiner

FIG. 3

300 form a matrix including a matrix material, and a plurality of electrically conductive structures and one or more particles embedded in the matrix

302

ELASTIC CONDUCTOR, DEVICE INCLUDING, AND METHOD OF FORMING THE SAME

CROSS-REFERENCE TO RELATED APPLICATION

This application claims the benefit of priority of Singapore application No. 10201703182T filed on Apr. 18, 2017, the contents of it being hereby incorporated by reference in its entirety for all purposes.

TECHNICAL FIELD

Various aspects of this disclosure relate to an elastic conductor. Various aspects of this disclosure relate to a method of forming an elastic conductor. Various aspects of this disclosure relate to a device including an elastic conductor.

BACKGROUND

Deformable electronics are believed to be essential technologies for next-generation smart, active, and user-interactive electronic systems. Pioneering work has been demonstrated in applications such as interactive displays, which can provide user tactile feedbacks with graphic displays, and prosthetic electronic skin, which can sense pressure and temperature on the device surface with improved brain/machine interfaces.

Stretchable conductors play a vital and indispensable role in deformable electronic systems to connect individual functional components. Conventional stretchable conductors usually trade-off improvement in stretchability with a decrease in electrical conductivity. The development of stretchable conductors has been primarily driven with different approaches being established to address the conductivity and stretchability trade-offs. Many fabrication approaches require complicated fabrication steps such as photolithography, transferring or embedding/transferring processes, limiting their application for large-scale, and cost-effective device fabrication.

Stretchable conductors with self-organized nanoparticles in polyurethane fabricated by vacuum-assisted flocculation approach has been previously reported. Stretchability of the conductor may reach up to 486%. In addition, a multilayer carbon nanotube (CNT) sheath coated on a rubber fiber core that could be stretched up to 1320% has also been previously demonstrated.

SUMMARY

Various embodiments may relate to an elastic conductor. The elastic conductor may include a matrix including a matrix material. The elastic conductor may also include a plurality of electrically conductive structures embedded in the matrix. The elastic conductor may also include one or more particles embedded in the matrix. The one or more particles may be configured to release an electrically conductive material upon stretching of the elastic conductor.

Various embodiments may relate to a method of forming an elastic conductor. The method may include forming a matrix including a matrix material, and a plurality of electrically conductive structures and one or more particles embedded in the matrix. The one or more particles may be configured to release an electrically conductive material upon stretching of the elastic conductor.

BRIEF DESCRIPTION OF THE DRAWINGS

The invention will be better understood with reference to the detailed description when considered in conjunction with the non-limiting examples and the accompanying drawings, in which:

FIG. 3 shows a schematic of a method of forming an elastic conductor according to various embodiments.

DETAILED DESCRIPTION

Figure 1:
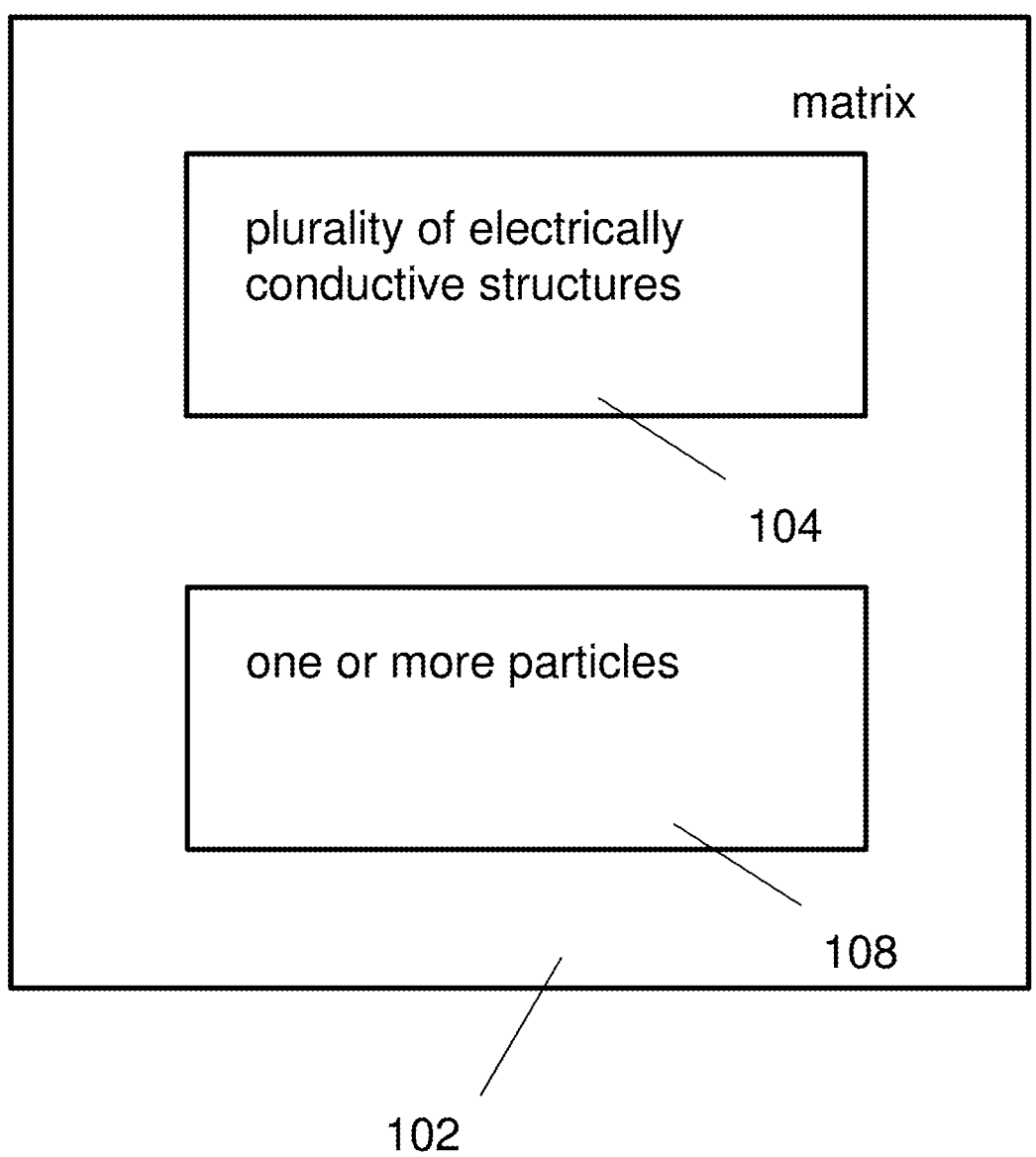
FIG. 1 is a general illustration of an elastic conductor according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or elastic conductors are analogously valid for the other methods or elastic conductors. Similarly, embodiments described in the context of a method are analogously valid for an elastic conductor, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

The film as described herein may be operable in various orientations, and thus it should be understood that the terms "top", "topmost", "bottom", "bottommost" etc., when used in the following description are used for convenience and to aid understanding of relative positions or directions, and not intended to limit the orientation of the elastic conductor.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Recently, ionic conductors have also been actively investigated due to their excellent transparency and stretchability (~1000% strain). Applications of ionic conductors with extremely high stretchability are still limited to devices with low power operations, such as dielectric elastomer actuators, sensors, and electroluminescent devices. Conventional conductors face challenges in scalability, electrical conductivity and stretchability.

Various embodiments may relate to approach to prepare stretchable conductors/printable conductive inks to address the challenge. The stretchability and mechanical stability of the conductors may significantly exceed previously reported printable elastic conductors. The developed elastic conductors may provide great impact on the development of soft electronic devices and may have a high potential for broad market deployment.

FIG. 1 is a general illustration of an elastic conductor 100 according to various embodiments. An elastic conductor 100 may also be referred to as a stretchable conductor, or a conductor.

The elastic conductor 100 may include a matrix 102 including a matrix material. The elastic conductor 100 may also include a plurality of electrically conductive structures 104 embedded in the matrix 102. The elastic conductor 100 may also include one or more particles 108 embedded in the matrix 102. The one or more particles 108 may be configured to release an electrically conductive material upon stretching of the elastic conductor 100.

In other words, the elastic conductor 100 may include a plurality of electrically conductive structures 104 and one or more particles 108 disperse in a matrix 102. Upon stretching, the one or more particles may release an electrically conductive material.

For avoidance of doubt, while FIG. 1 shows a matrix 100 have one region having a plurality of electrically conductive structures 104 and another region having one or more particles 108, the plurality of electrically conductive structures 104 and the one or more particles 108 may be arranged in any suitable manner within the matrix 102. In various embodiments, the plurality of electrically conductive structures 104 may be interspersed with the one or more particles 108. In various embodiments, the plurality of electrically conductive structures 104 and/or the one or more particles 108 may be uniformly distributed within the matrix 102, while in various other embodiments, the matrix may include one region having a higher concentration of the plurality of electrically conductive structures 104, and another overlapping or non-overlapping region having a higher concentration of the one or more particles 108.

The electrically conductive material released may electrically connect a first electrically conductive structure and a second electrically conductive structure of the plurality of electrically conductive structures 104. Upon stretching of the elastic conductor 100, the plurality of electrically conductive structures 104 may be further apart from one another. In other words, an average distance between the electrically conductive structures 104, e.g. a distance between the first electrically conductive structure and the second electrically conductive structure, of the stretched elastic conductor 100 may be greater than an average distance between the electrically conductive structures 104, e.g. a distance between the first electrically conductive structure and the second electrically conductive structure, of the original non-stretched elastic conductor 100. When the stretched elastic conductor 100 is stretched beyond a predetermined threshold, the first electrically conductive structure and the second electrically conductive structure, which may originally be in electrical contact or connection with each other, may no longer be in electrical contact or connection with each other The released electrically conductive material may fill in a "gap" between the electrically conductive structures 104, e.g. between the first electrically conductive structure and the second electrically conductive structure, of the stretched elastic conductor 100, and may provide an electrical connection between the electrically conductive structures 104, e.g. between the first electrically conductive structure and the second electrically conductive structure.

Various embodiments may improve electrical conductivity while maintaining stretchability. Various embodiments may seek to address or mitigate the issues faced by conventional stretchable or elastic conductors. Various embodiments may be scalable. Various embodiments may address challenges in terms of scalability, electrical conductivity and stretchability faced by conventional conductors. Various embodiments may be easy to fabricate.

In various embodiments, each particle of the one or more particles 108 may include a core of the electrically conductive material, and an outer shell surrounding the core. The core of each particle 108 may include or consist of the electrically conductive material. The electrically conductive material may be an electrically conductive liquid, such as a liquid metal alloy. The electrically conductive material may be or may include eutectic gallium indium (EGaIn). In various embodiments, the outer shell may include a solid. The outer shell may be or may include or consist of gallium oxide ($Ga_2O_3$). Upon stretching, the outer shell of $Ga_2O_3$ may break or may be deformed, and the EGaIn may flow to provide an electrical connection between the plurality of electrically conductive structures 104.

The one or more particles 108 including an eutectic gallium indium (EGaIn) core, and a gallium oxide ($Ga_2O_3$) outer shell may be referred to as eutectic gallium indium particles (EGaInPs). In various embodiments, a weight ratio of the one or more particles to the matrix material may be any value selected from a range from 0.5:1 to 2.5:1, e.g. 1:1 to 2:1. In various embodiments, a weight ratio within the range from 1:1 to 2:1 may provide more stability, i.e. less change in resistance or conductivity upon stretching.

Upon exposure to air or oxygen, the eutectic gallium indium may oxidize to form gallium oxide. Accordingly, a predetermined period of time after the electrically conductive material has been released, an outer shell of $Ga_2O_3$ may form by oxidation of EGaIn. Accordingly, the one or more particles 108 may be formed or re-formed after release of the electrically material, e.g. EGaIn.

In various embodiments, the electrically conductive material may be or may include an alloy of indium and gallium, or an alloy of indium, gallium and tin, or an alloy of indium, gallium, tin and zinc, or an alloy of gallium, indium and other metallic elements. The outer shell may include may be or may include or consist of gallium oxide ($Ga_2O_3$).

In various embodiments, the matrix 102 may further include an additive, such as acrylic acid. The additive may help to stabilize changes in conductivity/resistivity of the stretchable conductor 100 upon stretching.

In various embodiments, the plurality of electrically conductive structures 104 may be bonded, e.g. by chemical bonding or hydrogen bonding to the matrix 102/matrix material. In various embodiments, the additive may be bonded to the matrix material, e.g. EVA. The electrically conductive structures 104 may be bonded to the additive. The additive may help improve bonding between the electrically conductive structures 104 and the matrix 102.

In various embodiments, the one or more particles 108 may also be bonded, e.g. by chemical bonding to the matrix 102. The one or more particles 108 may be bonded to the matrix material and/or the additive.

In various embodiments, the electrically conductive structures 104 may be any one type of structure selected from a group consisting of flakes, nanoparticles, nanotubes, and nanowires. The electrically conductive structures 104 may also be referred to as an electrically conductive filler or a conductive filler.

In various embodiments, the plurality of electrically conductive structures 104 may include any one material selected from a group consisting of silver, gold, and carbon. The plurality of electrically conductive structures 104 may include a metal.

In various embodiments, the plurality of electrically conductive structures 104 may be silver flakes, carbon nanotubes, silver nanoparticles, or silver nanowires.

In various embodiments, the matrix material may be any one polymer selected from a group consisting of ethylene vinyl acetate (EVA), (hydroxypropyl) methyl cellulose, and poly(styrene-butadiene-styrene) rubber. In various embodiments, the matrix material may be a fluorine rubber.

In various embodiments, the elastic conductor 100 may achieve a stretchability exceeding 700% strain, or exceeding 800% strain, or exceeding 900% strain.

Various embodiments may provide a device including the elastic conductor. The device may for instance be a touch sensor array or a stretchable light emitting device or diode array.

Figure 2:
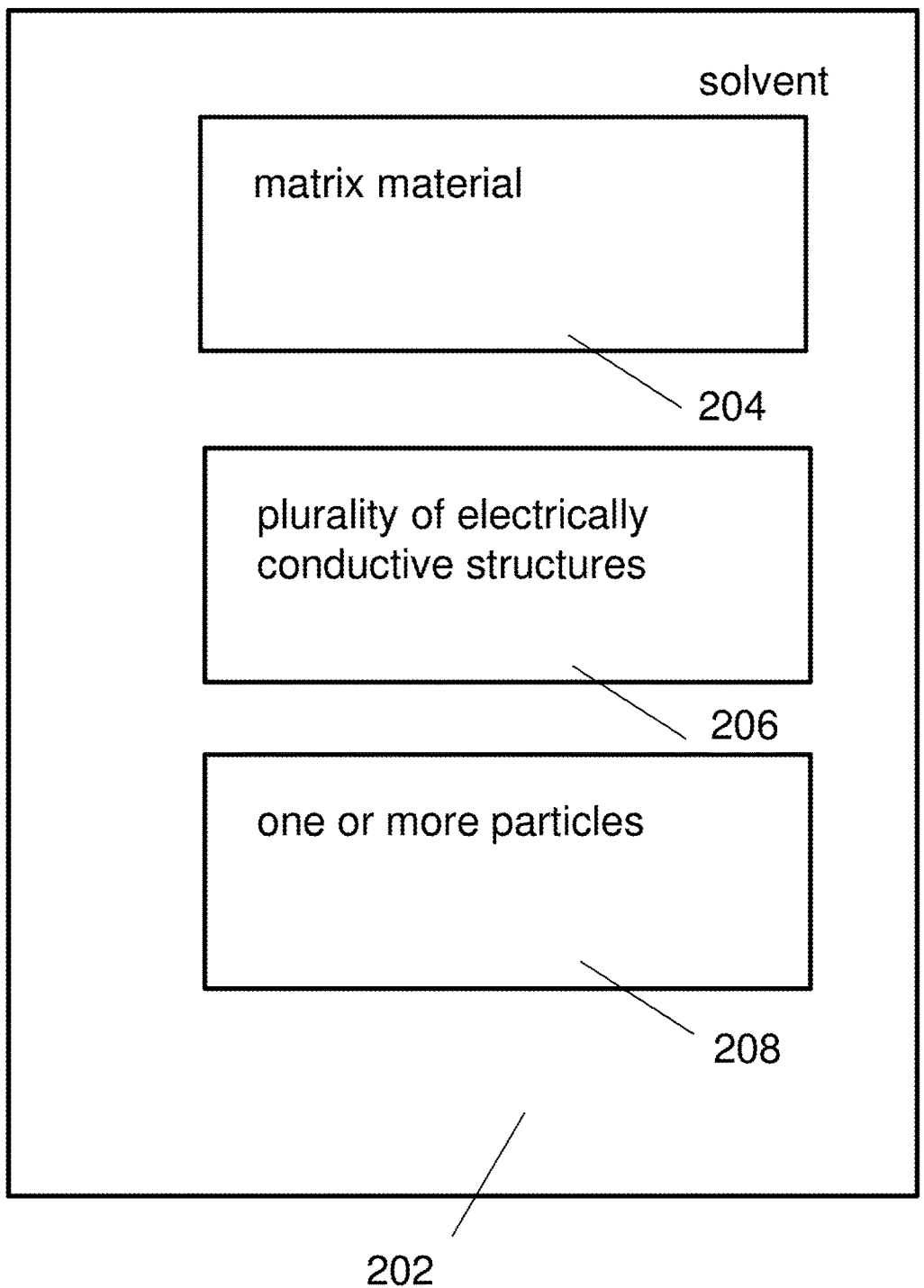
FIG. 2 is a general illustration of a composition according to various embodiments.

Various embodiments may provide a composition for forming the elastic conductor. FIG. 2 is a general illustration of a composition 200 according to various embodiments. The composition 200 may include a solvent 202, e.g. chlorobenzene. The composition 200 may include a matrix material 204, e.g. ethylene vinyl acetate (EVA). The composition may also include one or more plurality of electrically conductive structures 206, e.g. silver flakes. The composition may further include one or more particles 208, e.g. $Ga_2O_3$ encapsulated EGaIn particles (EGaInPs). The matrix material 204, the one or more plurality of electrically conductive structures 206, and the one or more particles 208 may be dissolved or dispersed in the solvent 202.

The composition 200 may further include an additive.

FIG. 3 shows a schematic of a method of forming an elastic conductor according to various embodiments. The method may include, in 302, forming a matrix including a matrix material, and a plurality of electrically conductive structures and one or more particles embedded in the matrix. The one or more particles may be configured to release an electrically conductive material upon stretching of the elastic conductor.

Various embodiments may provide a method of forming an elastic conductor as described herein.

In various embodiments, forming the matrix may include forming a composition including the matrix material, the plurality of electrically conductive structures, the one or more particles, and a solvent.

The method may further include depositing the composition on a substrate. The solvent may evaporate from the deposited composition, thereby forming the elastic conductor.

In various embodiments, the composition may be deposited on the substrate by three-dimensional (3D) printing or direct ink writing.

The matrix may further include an additive, such as acrylic acid. The additive may be included in the composition.

Each particle of the one or more particles may include a core of the electrically conductive material and an outer shell surrounding the core.

The electrically conductive material may be or may include eutectic gallium indium. The core may include or consist of eutectic gallium indium.

The outer shell may include or consist of gallium oxide.

In various embodiments, the electrically conductive material may be or may include an alloy of indium and gallium, or an alloy of indium, gallium and tin, or an alloy of indium, gallium, tin and zinc, or an alloy of gallium, indium and other metallic elements.

The electrically conductive structures may be any one type of structure selected from a group consisting of flakes, nanoparticles, nanotubes, and nanowires.

The plurality of electrically conductive structures may include any one material selected from a group consisting of silver, gold, and carbon.

The matrix material may be any one polymer selected from a group consisting of ethylene vinyl acetate (EVA), (hydroxypropyl) methyl cellulose, and polystyrene-butadiene-styrene) rubber.

Figure 4A:
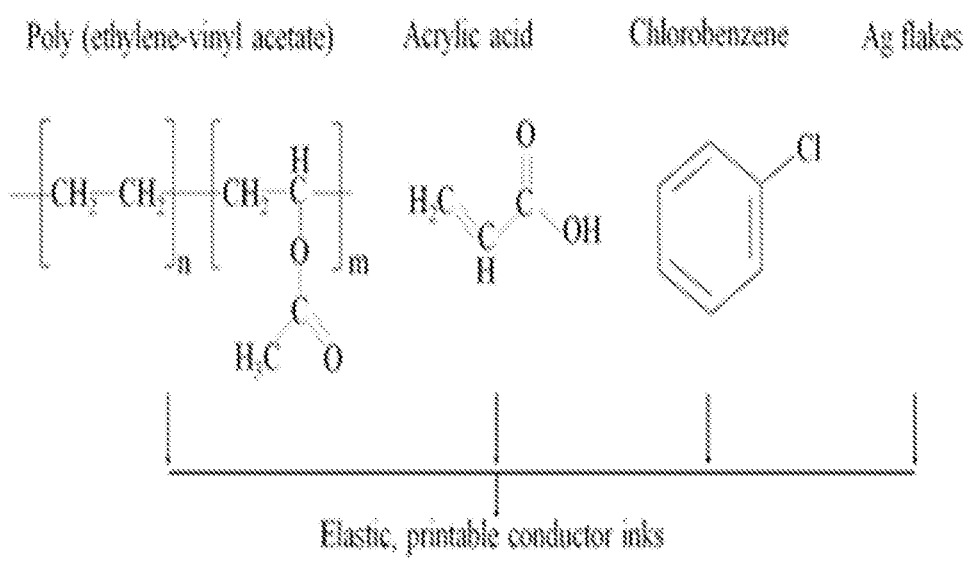
FIG. 4A shows the molecular structures of various constituents of a formulation or composition for forming an elastic conductor according to various embodiments.

FIG. 4A shows the molecular structures of various constituents of a formulation or composition for forming an elastic conductor according to various embodiments. The formulation or composition may include electrically conductive structures, e.g. metallic components such as silver (Ag) flakes, as conductive fillers. The formulation or composition may also include a matrix material, e.g. an elastic polymeric or elastomeric material such as ethylene vinyl acetate (EVA) copolymer. The formulation or composition may include a suitable solvent such as chlorobenzene. The formulation or composition may additionally include an additive for the matrix, such as acrylic acid (AA). The elastic conductor according to various embodiments may be formed by mixing the various constituents in various appropriate weight ratios. The formulation or composition may also be referred to as a conductive ink.

It may also be envisioned that the conductive fillers may alternatively be single walled carbon nanotubes (SWCNTs), silver nanoparticles, and silver nanowires. The matrix may be a polymer matrix including materials such as (hydroxypropyl) methyl cellulose, fluorine rubbers, and styrene-butadiene-styrene (SBS) rubber etc.

Silver (Ag) flakes may have superior electrical conductivity, and may be fabricated in a more cost-effective manner. Silver flakes may be about hundred times cheaper than silver (Ag) nanowires (1 g of Ag flakes cost few dollars compared with a few hundred dollars for Ag nanowires).

The higher aspect-ratio (about 10 to about 100) of flake structures may be more favorable with lower percolation threshold, and larger contact areas between flakes as compared to other structures such as spherical silver particles. Earlier works on silver flakes demonstrate a maximum strain of about 270%. Cycling strains may limit strain in the range of about 30% to about 40%. In order to improve the stretchability of elastic conductors, many approaches have been attempted, such as forming a core-cell structures with the conductive materials wrapping around the elastic fibers, or forming dynamic self-organizing conductive layers on the surface of the elastic substrates.

Various embodiments may relate to a much simpler and manufacturable approach to achieve super-elastic conductors utilizing the combined merits of EVA with excellent stretchability (>1000% elongation for pure EVA itself) and strong bonding to the conductive fillers. The strong bonding between EVA and the conductive fillers may be provided by hydrogen bonding between the acetate of the EVA and/or OH groups of the acrylic acid present in the matrix, with the fatty acid groups present on the surface of Ag flakes. The fatty acid groups may already be present on commercially available Ag flakes.

Figure 4B:
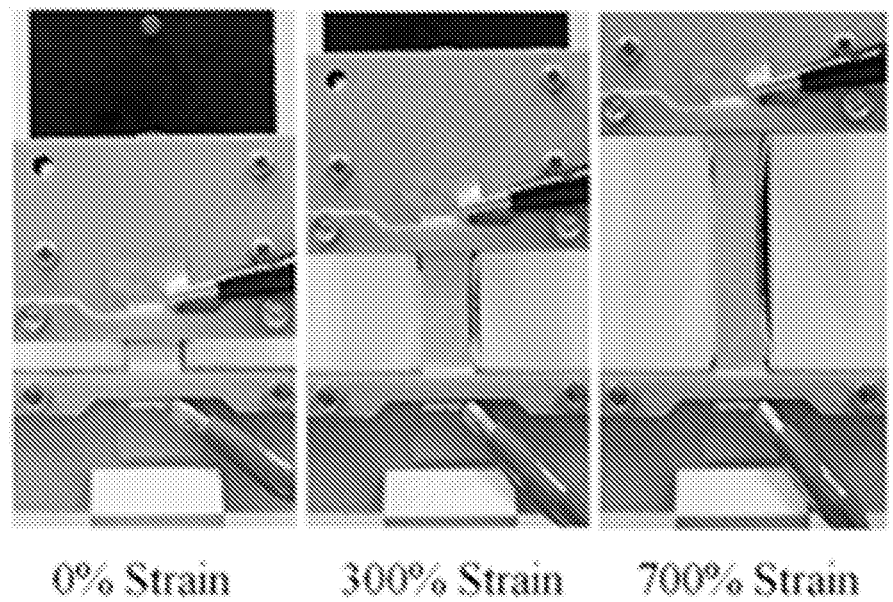
FIG. 4B shows images of the elastic conductor according to various embodiments at 0%, 300% and 700% strains.

By using EVA as the host polymer, a stretchability of about 700% strain may be achieved in the printable elastic conductor. FIG. 4B shows images of the elastic conductor according to various embodiments at 0%, 300% and 700% strains.

After adding in acrylic acid, stretchability of the elastic conductor can be further improved to about 1000% strain. The silver content in the composite conductor may be an important component affecting the electrical conductivity and stretchability of the elastic conductor.

An EVA solution may be prepared by dissolving EVA pellets in chlorobenzene with the weight ratio fixed at 1:6 (EVA:chlorobenzene). The weight ratio between the Ag flakes and EVA solution may be varied from 0.7:1 to 1.1:1 (volume fraction of Ag flakes after drying: from 31.07% to 41.46%), and the electrical conductivity of the resultant elastic conductor formed may be measured. It has been found that increased amount of Ag flakes in the polymer matrix may lead to enhancement in the conductivity of the composite. The electrical conductivity (a) of a composite including an electrically conductive filler in polymer matrix may be predicted with a power-law relationship and the percolation theory $$\sigma = \sigma_0 (V_f - V_c)^s \quad (1)$$

wherein $\sigma_0$ is the electrical conductivity of the conductive filler, $V_f$ is the volumetric fraction of the filler in the matrix, $V_c$ is the volumetric fraction at percolation threshold, and s is a fitting exponential.

Figure 4C:
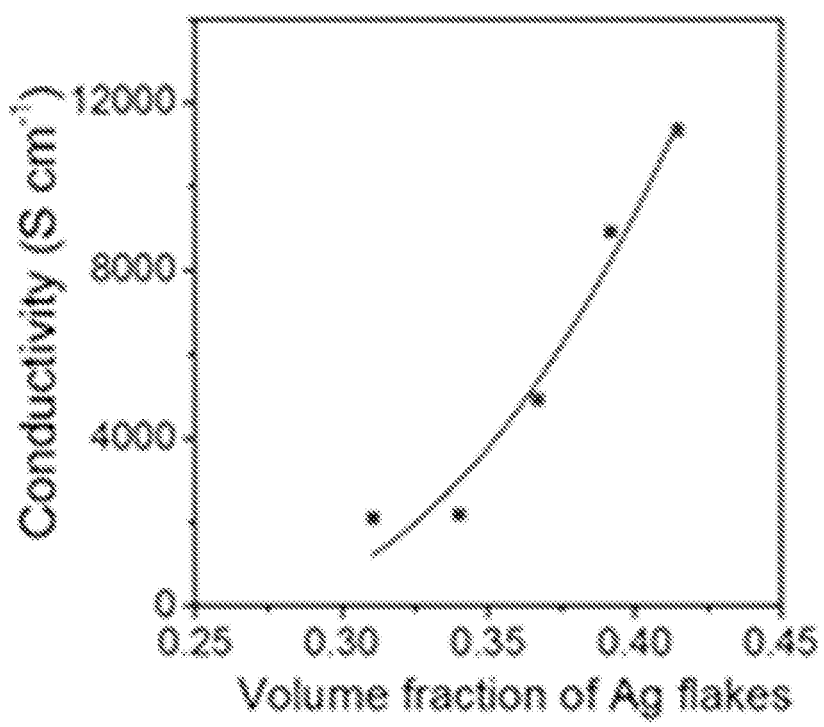
FIG. 4C shows a plot of electrical conductivity as a function of volume fraction of the silver (Ag) flakes showing experimental data of electrical conductivity of composite conductors having different proportion of silver flakes according to various embodiments.

FIG. 4C shows a plot of electrical conductivity as a function of volume fraction of the silver (Ag) flakes showing experimental data of electrical conductivity of composite conductors having different proportion of silver flakes according to various embodiments. FIG. 4C indicates that the experimental data shows good agreement with percolation theory. The electrical conductivity of the elastic conductor may reach 11240 S/cm when the weight ratio of the silver flakes increases to 1.1.

The printable conductor may be directly formed onto an Ecoflex 0030 substrate by stencil printing or other printing methods. The printable conductor may be formed by applying the composition or formulation on the substrate.

A stencil pattern may be designed having a rectangular shape with 20 mm in length and 5 mm in width. The printed conductor may be allowed to dry in room temperature for about 30 mins. The resistance change of the elastic conductor may be measured when different stretching strains were applied. The resistance change may refer to a ratio of the resistance of the conductor (R) stretched at the provided strain relative to the resistance of unstretched conductor ($R_0$).

Figure 5A:
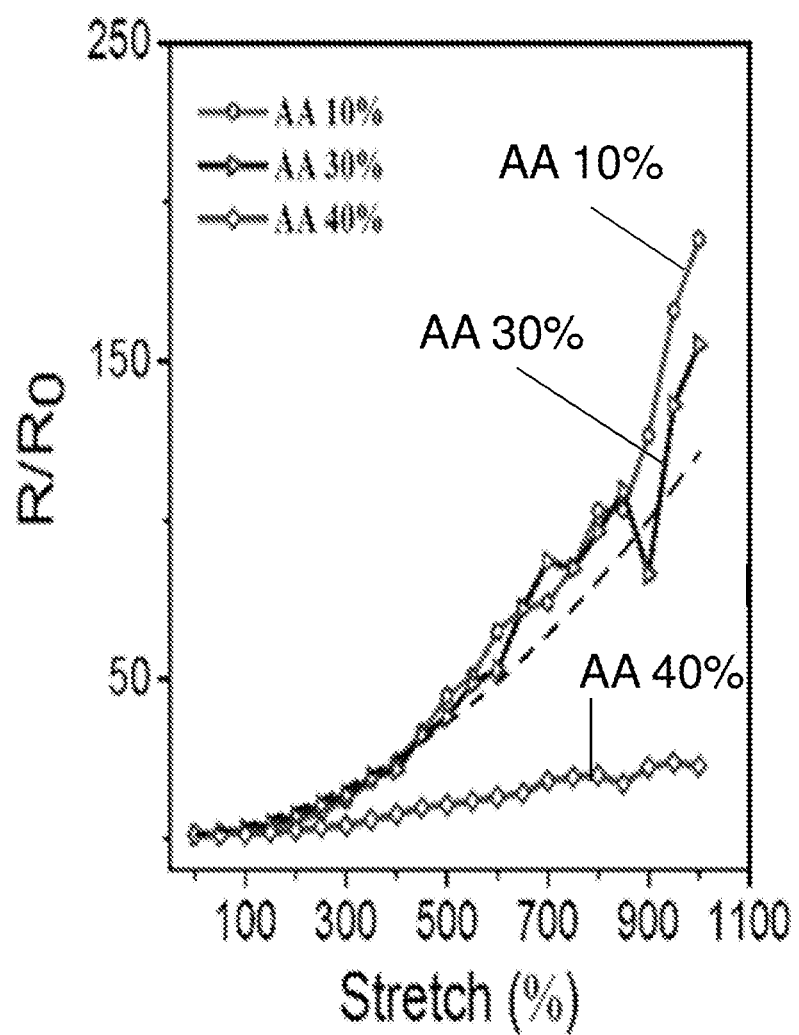
FIG. 5A shows a plot of resistance change ($R/R_0$) as a function of stretchability (in percent or %) illustrating the resistance change of the elastic conductor with different acrylic acid (AA) content according to various embodiments under stretching.

FIG. 5A shows a plot of resistance change ($R/R_0$) as a function of stretchability (in percent or %) illustrating the resistance change of the elastic conductor with different acrylic acid (AA) content according to various embodiments under stretching. The amount of acrylic acid shown in FIG. 5A may be in weight percent (%) relative to the weight of the EVA solution. The weight ratio of the Ag flakes to EVA solution may be fixed at 4:5, and the weight ratio of AA to EVA solution may be adjusted from 1:10 (line with circles), to 3:10 (line with triangles), and to 4:10 (line with diamonds).

As shown in FIG. 5A, the stability of the resistance may be significantly improved by increasing the amount of AA (increasing weight ratio of AA relative to EVA solution while keeping the amount of silver flakes in the EVA solution constant).

As shown in FIG. 5A, the resistance change of the elastic conductor ($R/R_0$, where R is the resistance of the conductor under strain and $R_0$ is the resistance of the conductor before stretching) may be 188, 155, and 23 at the weight ratios of 1:10, 3:10, and 4:10, respectively. The addition of AA may stabilize the EVA matrix through hydrogen bonding. The AA may also improve the chemical bonding between the Ag flakes and the polymer matrix, and may plasticize the EVA copolymer, leading to the improved electrically stability and stretchability.

Figure 5B:
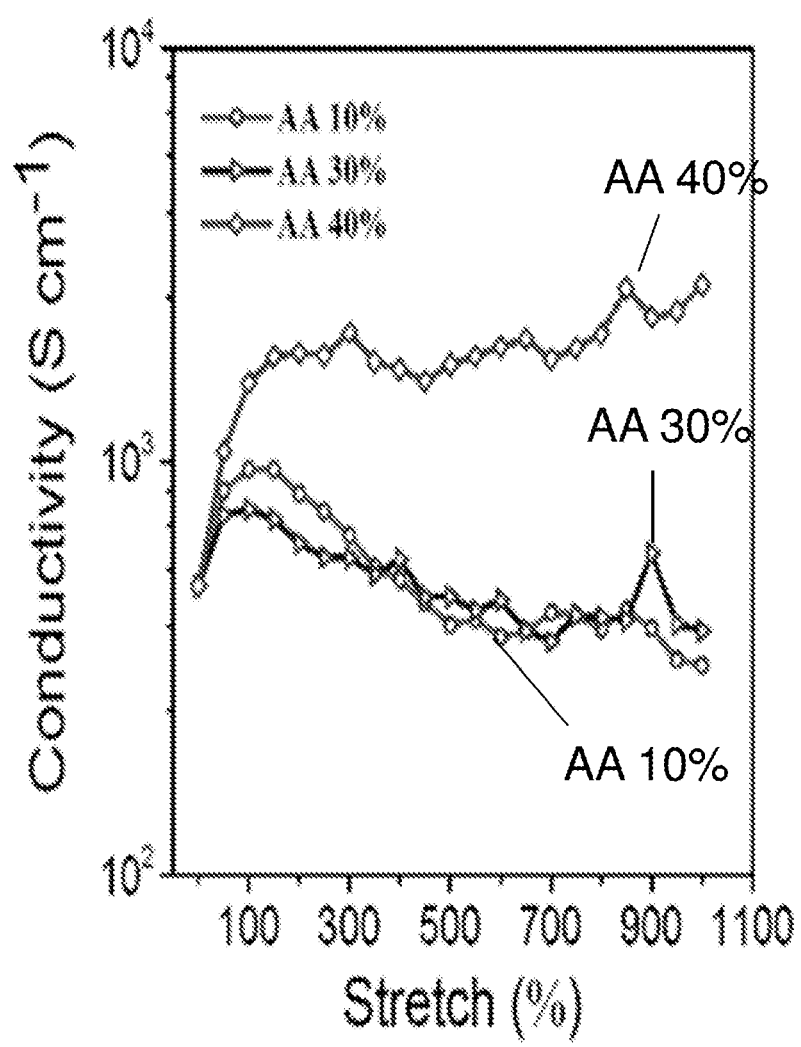
FIG. 5B shows a plot of electrical conductivity (in siemens per centimeter or S cm$^{-1}$) as a function of stretchability (in percent or %) illustrating electrical conductivity changes of the elastic conductor with different acrylic acid (AA) content according to various embodiments under stretching.

FIG. 5B shows a plot of electrical conductivity (in siemens per centimeter or S cm$^{-1}$) as a function of stretchability (in percent or %) illustrating electrical conductivity changes of the elastic conductor with different acrylic acid (AA) content according to various embodiments under stretching. The line with circles denotes a weight ratio of AA to EVA solution of 1:10, the line with triangles denotes a weight ratio of AA to EVA solution of 3:10, and the line with diamonds denotes a weight ratio of AA to EVA solution of 4:10.

The composite conductor including the conductive filler and the matrix material may be assumed to be incompressible during stretching. The electrical conductivity of the elastic conductor under strain ($\sigma$) may be provided by:

$$\sigma/\sigma_0 = \varepsilon^2 R_0/R \quad (2)$$

wherein $\sigma_0$ the electrical conductivity of the unstrained or unstretched elastic conductor, $\varepsilon$ is the stretch ratio, R is the resistance of the conductor under strain, and $R_0$ is the resistance of the unstrained or unstretched conductor.

Figure 5C:
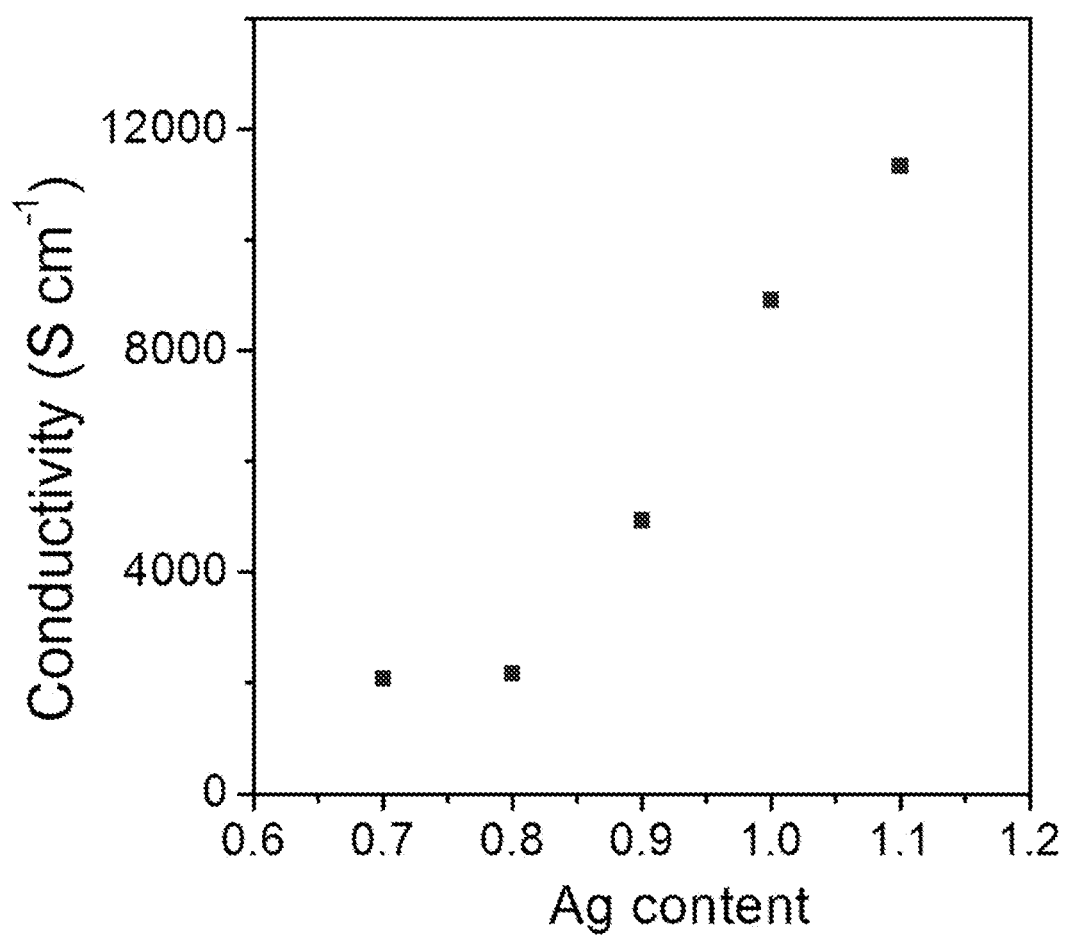
FIG. 5C shows a plot of electrical conductivity (in siemens per centimeter or S cm$^{-1}$) as a function of silver (Ag) content illustrating the variation in electrical conductivity of the elastic conductor with different amounts of silver (Ag) content relative to ethylene vinyl acetate (EVA) solution according to various embodiments.

FIG. 5C shows a plot of electrical conductivity (in siemens per centimeter or S cm$^{-1}$) as a function of silver (Ag) content illustrating the variation in electrical conductivity of the elastic conductor with different amounts of silver (Ag) content relative to ethylene vinyl acetate (EVA) solution according to various embodiments. The silver content may refer to a weight ratio of Ag to EVA solution. For instance, a value of 0.6 may represent that the weight ratio of Ag to EVA solution is 6:10.

In order to further improve the stretchability and stability of the elastic conductor, the conductive filler may be electrically anchored with eutectic gallium indium particles (EGaInPs), which may be prepared via sonication in acetone or other solvent (such as ethanol and toluene). A gallium oxide ($Ga_2O_3$) layer (~0.5 nm) may form naturally to encase the EGaIn in a stable particle structure after the sonication process.

Figure 6A:
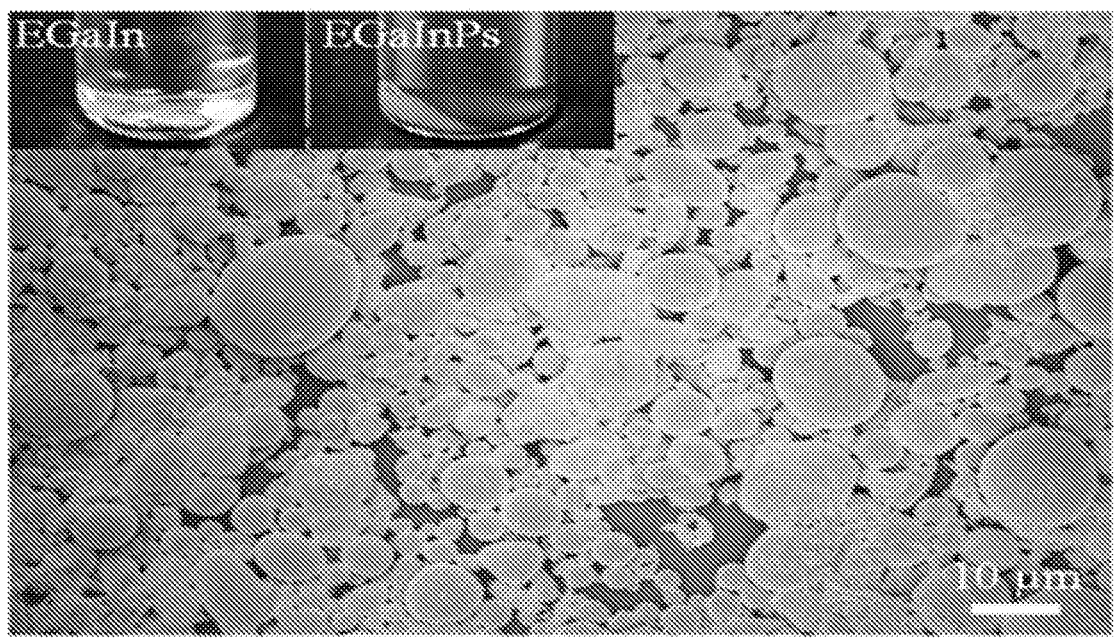
FIG. 6A shows a scanning electron microscopy (SEM) image of eutectic gallium indium particles (EGaInPs) according to various embodiments, with the insets of FIG. 6A showing (left) eutectic gallium indium alloy in acetone, and (right) eutectic gallium indium particles in acetone according to various embodiments.
Figure 6B:
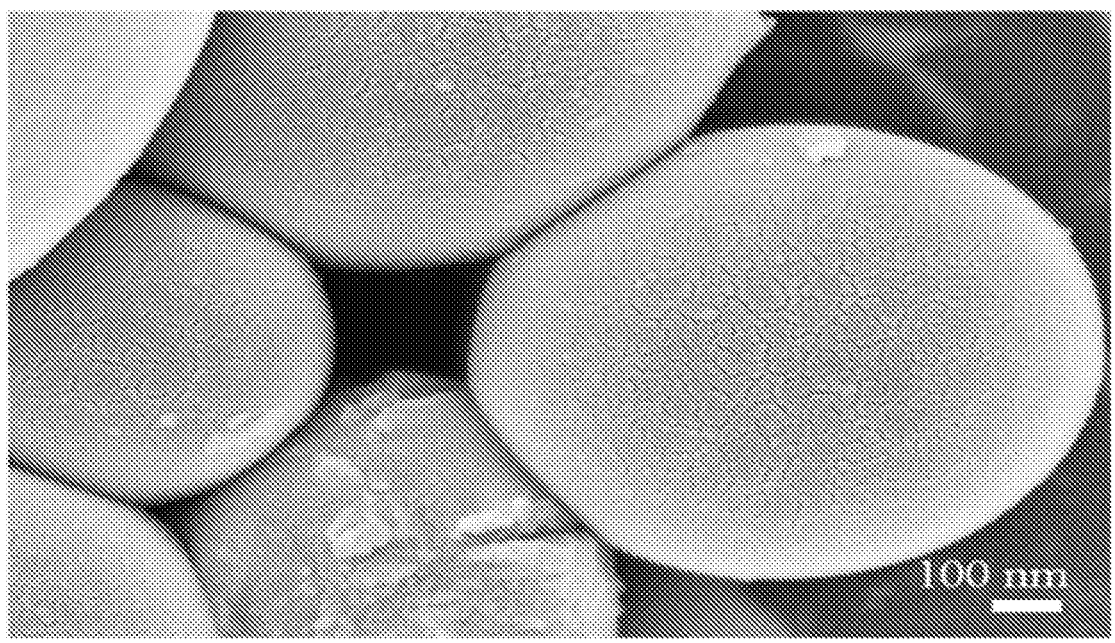
FIG. 6B shows an enlarged scanning electron microscopy (SEM) image of eutectic gallium indium particles (EGaInPs) according to various embodiments.

Scanning electron microscopy (SEM) images of the EGaInPs are provided in FIGS. 6A-B. FIG. 6A shows a scanning electron microscopy (SEM) image of eutectic gallium indium particles (EGaInPs) according to various embodiments, with the insets of FIG. 6A showing (left) eutectic gallium indium alloy in acetone, and (right) eutectic gallium indium particles in acetone according to various embodiments. FIG. 6B shows an enlarged scanning electron microscopy (SEM) image of eutectic gallium indium particles (EGaInPs) according to various embodiments.

Figure 6C:
FIG. 6C shows a scanning electron microscopy (SEM) image of the top planar surface of the elastic conductor including the eutectic gallium indium particles (EGaInPs) according to various embodiments after drying.

FIG. 6C shows a scanning electron microscopy (SEM) image of the top planar surface of the elastic conductor including the eutectic gallium indium particles (EGaInPs) according to various embodiments after drying.

Different weight ratios of EGaInPs may be mixed with Ag/EVA (weight ratio fixed at 1:1). The conductive ink may be directly applied onto a Very High Bond (VHB) tape elastic substrate using stencil printing. After drying in room temperature for 30 mins, the resistance change of the elastic conductor may be measured under different stretching strains. Remarkably, stability of the resistance may significantly be improved by the EGaInPs.

Figure 7A:
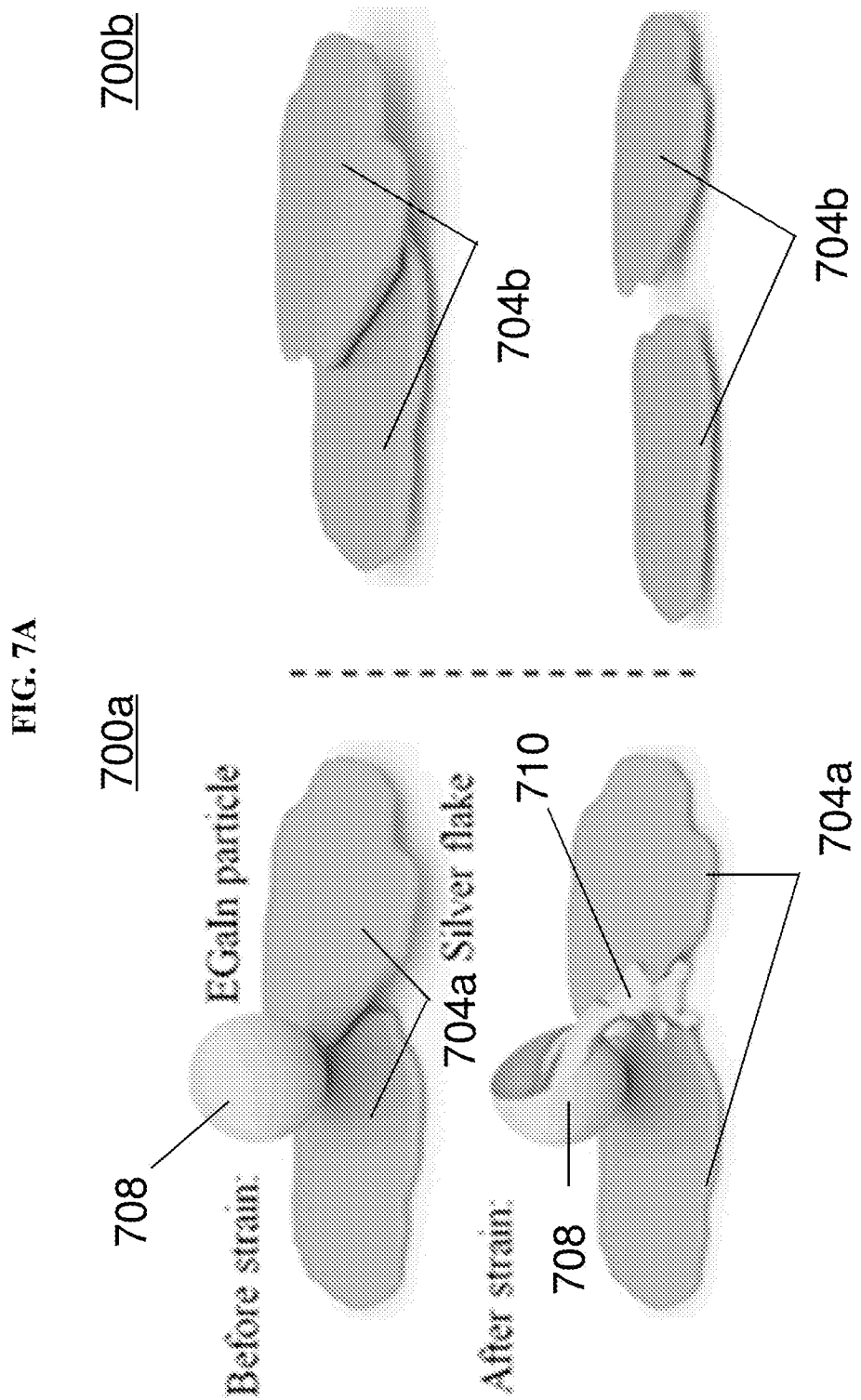
FIG. 7A is a schematic illustrating a portion of an elastic conductor including eutectic gallium indium particles (EGaInPs), as well as a portion of another elastic conductor without eutectic gallium indium particles (EGaInPs) according to various embodiments.

FIG. 7A is a schematic illustrating a portion of an elastic conductor 700a including eutectic gallium indium particles (EGaInPs) 708, as well as a portion of another elastic conductor 700b without eutectic gallium indium particles (EGaInPs) according to various embodiments.

FIG. 7A illustrates how the elastic conductor 700a including eutectic gallium indium particles (EGaInPs) 708 retain electrical performance under high mechanical deformation.

Connections between silver flakes may provide the conducting pathways in the elastic conductors 700a-b. When two silver flakes 704a-b are in contact, electrons may flow from one silver flake 704a-b to the other silver flake 704a-b upon application of a potential difference.

When the elastic conductor 700b is stretched, the reduced overlap between silver flakes 704b may lead to a reduction in the number of conducting pathways, which may lead to a reduction in the electrical conductivity in elastic conductor 700b.

In contrast, for elastic conductor 700a, while the silver flakes 704a may also be spaced further apart when the elastic conductor 700a is stretched, the $Ga_2O_3$ stabilized EGaInPs 708 may also be vulnerable to mechanical deformations, and may release the encapsulated EGaIn 710 under strain to regain or at least partially compensate for the electrical connection between the Ag flakes. The EGaIn may provide a dynamic and robust electrical anchor between the Ag flakes 704a, and may be remarkably different from the electrical connections established by overlapping between the flakes. The elastic conductor 700a may demonstrate significant improved stability and reversibility under large mechanical strains. The elastic conductor 700a may show more stability and reversibility under mechanical strain as compared to elastic conductor 700b.

Figure 7B:
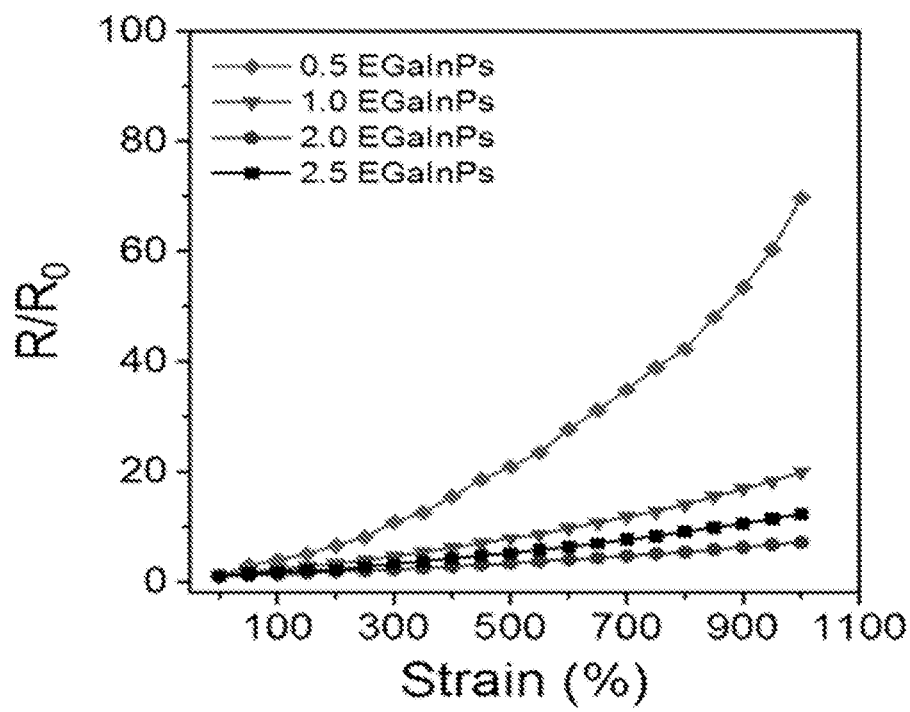
FIG. 7B shows a plot of resistance change ($R/R_0$) as a function of strain (in percent or %) illustrating the resistance changes of the elastic conductors with different amounts of eutectic gallium indium particles (EGaInPs) when stretched.

FIG. 7B shows a plot of resistance change ($R/R_0$) as a function of strain (in percent or %) illustrating the resistance changes of the elastic conductors with different amounts of eutectic gallium indium particles (EGaInPs) when stretched. The weight ratio of silver flakes (Ag) to EVA solution may be fixed at 1:1. The weight ratio of EGaInPs to EVA may be varied from 0.5:1 (line with diamonds), to 1:1 (line with triangles), to 2:1 (line with circles), to 2.5:1 (line with squares). The resistance change may be measured as a ratio of $R/R_0$, where R may be the resistance of the conductor under strain and $R_0$ is the resistance of the unstrained conductor.

The resistance change $R/R_0$ is 69.7, 19.9, and 7.2 with the weight ratios of EGaInPs at 0.5, 1.0, and 2.0 respectively.

A further increase in the EGaInPs amount may lead to sintering between adjacent EGaInPs which form larger EGaIn particles, which may segregate from the polymer matrix, resulting in increased resistance change under strain.

To study the reversibility of the elastic conductor, the elastic conductor may be subjected to repetitive stretching cycles with strains to 800% at a high stretching speed (1000 min/min, ~400% strain per second on the test sample).

Figure 7C:
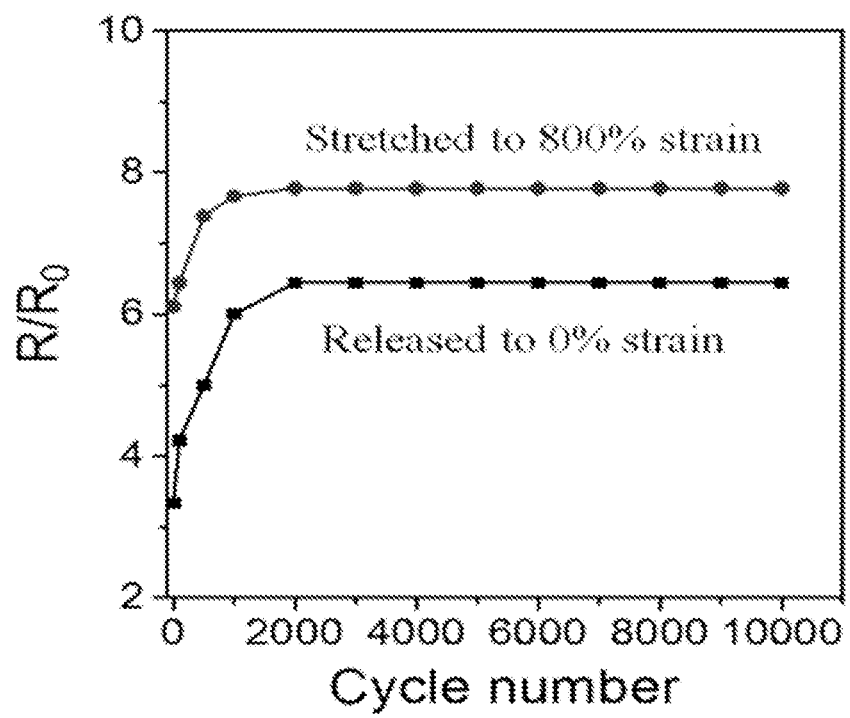
FIG. 7C shows a plot of resistance change ($R/R_0$) as a function of cycle numbers illustrating changes in resistance of the elastic conductor after the elastic conductor is repetitively stretched to high strains of 800% according to various embodiments.
Figure 7D:
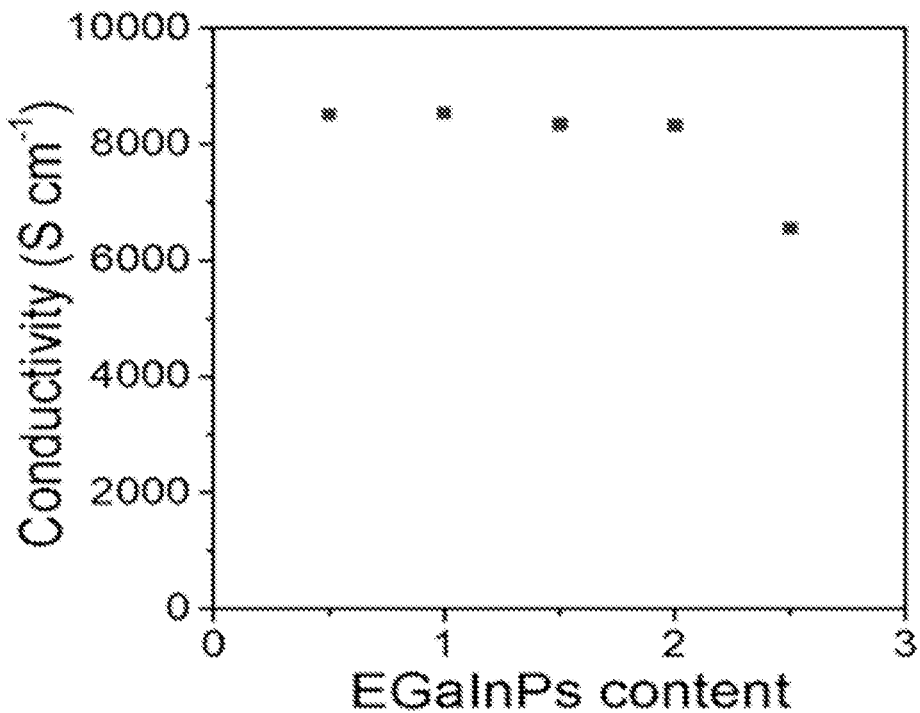
FIG. 7D is a plot of electrical conductivity (in siemens per second or S cm$^{-1}$) as a function of eutectic gallium indium particles (EGaInPs) content illustrating the electrical conductivity of the elastic conductor with different amounts of eutectic gallium indium particles according to various embodiments.

FIG. 7C shows a plot of resistance change ($R/R_0$) as a function of cycle numbers illustrating changes in resistance of the elastic conductor after the elastic conductor is repetitively stretched to high strains of 800% according to various embodiments. The resistance change $R/R_0$ at 800% strain may be maintained at about 7.8 after $10^4$ cycles. FIG. 7D is a plot of electrical conductivity (in siemens per second or S $cm^{-1}$) as a function of eutectic gallium indium particles (EGaInPs) content illustrating the electrical conductivity of the elastic conductor with different amounts of eutectic gallium indium particles according to various embodiments. The EGaInPs content may refer to the weight ratio of EGaInPs relative to EVA.

The addition of particles such as EGaInPs may be applied to most elastic conductor systems which are based on conductive fillers in elastic polymer matrix.

For instance, Ag nanoparticles are typically considered to be an unfavorable conductive filler as a higher percolation threshold is required, and there is a larger number of particle-particle junctions in the stretchable matrix.

With EGaInPs, the stretchability and stability of the Ag nanoparticle based conductors may also improve impressively. Without the EGaInPs, the resistance change $R/R_0$ may increase above 1000 at the stretching strain of 100%. With the EGaInPs, the resistance change $R/R_0$ may be reduced to 3.5 at 100% strain. The Ag nanoparticle conductors can be stretched to 1000% strain with the resistance change maintained below 20, validating that the EGaInPs are indeed efficient to improve the stretchability and stability of elastic conductors.

Figure 7E:
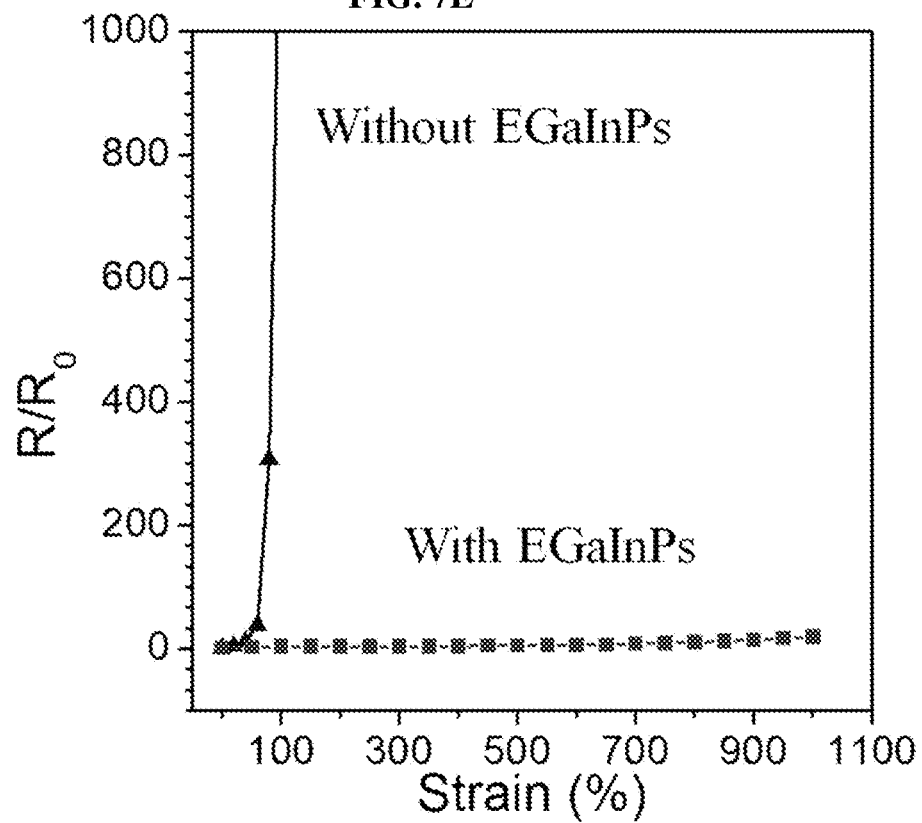
FIG. 7E shows a plot of resistance change (R/R$_0$) as a function of strain (in percent or %) of an elastic conductor including silver nanoparticles as the electrically conductive filler according to various embodiments illustrating the effect eutectic gallium indium particles (EGaInPs) have on the elastic conductor.

FIG. 7E shows a plot of resistance change ($R/R_0$) as a function of strain (in percent or %) of an elastic conductor including silver nanoparticles as the electrically conductive filler according to various embodiments illustrating the effect eutectic gallium indium particles (EGaInPs) have on the elastic conductor. As seen from FIG. 7E, if the elastic conductor does not have EGaInPs, the resistance change $R/R_0$ may be increased above 1000 at the stretching strain of 100% or even 80%. The resistance change $R/R_0$ may be reduced to 3.5 at 100% strain with the inclusion of EGaInPs in the elastic conductor.

Various embodiments may relate to an elastic conductor including Ag nanoparticles and EGaInPs, which may be stretched to 1000% strain, with the resistance change maintained below 20, which may show that the EGaInPs are able to improve the stretchability and stability of elastic conductors.

Direct patterning methods such as three-dimensional (3D) printing (or direct ink writing) may offer attractive advantages. Direct patterning methods may enable the creation of devices with large-scale adoption, flexible design, compatibility with arbitrary substrate, and 3D device architectures.

A touch sensor array including the elastic conductor may be patterned onto an elastic substrate (e.g. 3M VHB tape) using 3D printing or direct ink writing of a composition or formulation on the substrate. The composition or formulation may pass through a cylindrical nozzle.

The 3×2 touch sensor array may include sensors with the dimensions of 7 mm×7 mm.

Figure 8A:
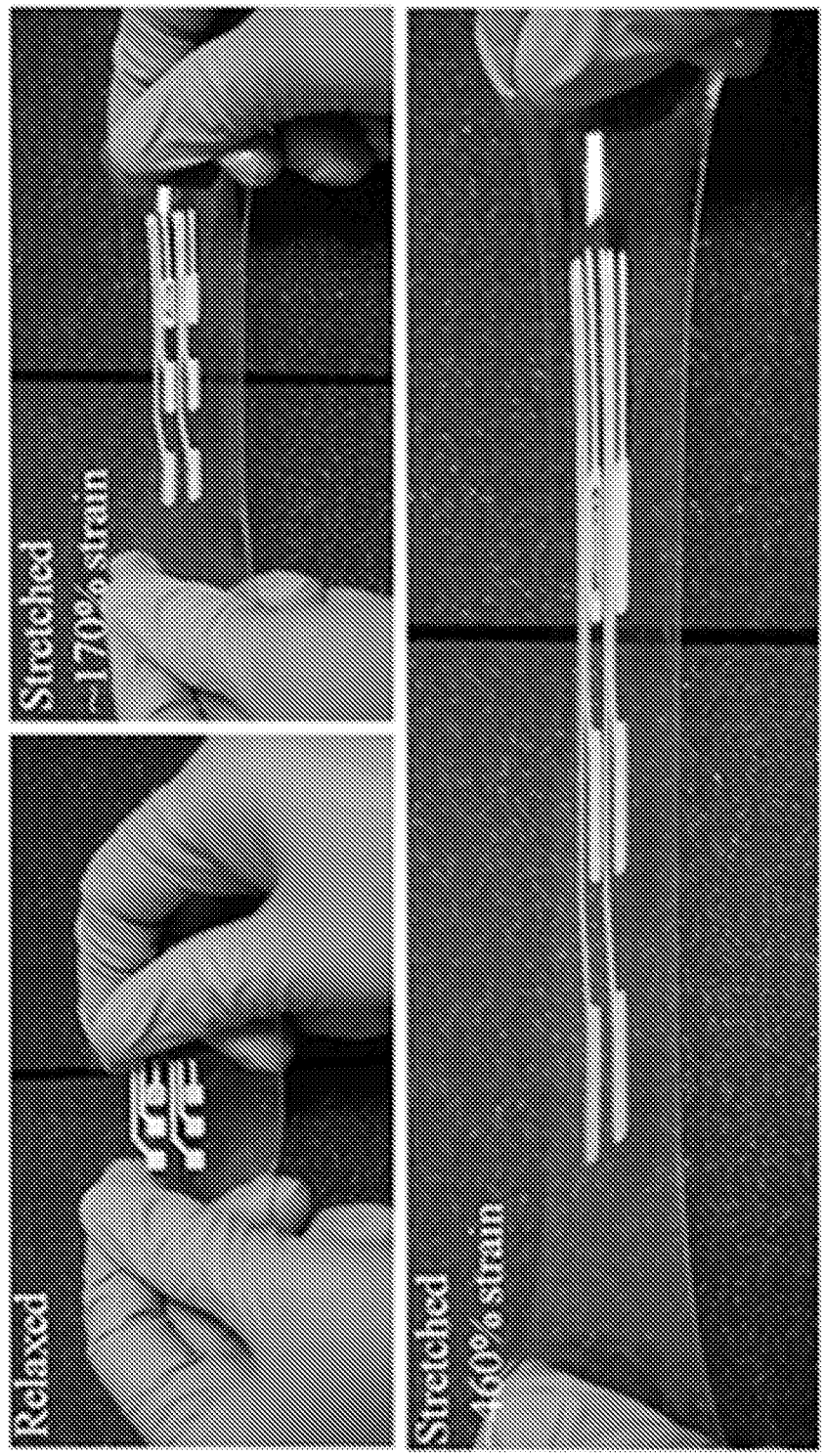
FIG. 8A shows (top left) an image of an unstretched touch sensor array according to various embodiments; (top right) the touch sensor array according to various embodiments stretched to 170% strain; and (bottom) the touch sensor array according to various embodiments stretched to 460% strain.

The touch sensing mechanism may be based on the self-capacitance changes of the sensor with/without touch. Briefly, a sensor may have an initial capacitance $C_0$ between the electrode and the ground. Contact of the touch sensor with a finger may lead to a parallel connection of $C_0$ with the capacitance of the human body $C_b$, thus increasing the total capacitance of the touch sensor. The sensor array can be deformed to high stretching strains, as shown in FIG. 8A. FIG. 8A shows (top left) an image of an unstretched touch sensor array according to various embodiments; (top right) the touch sensor array according to various embodiments stretched to 170% strain; and (bottom) the touch sensor array according to various embodiments stretched to 460% strain.

Figure 8B:
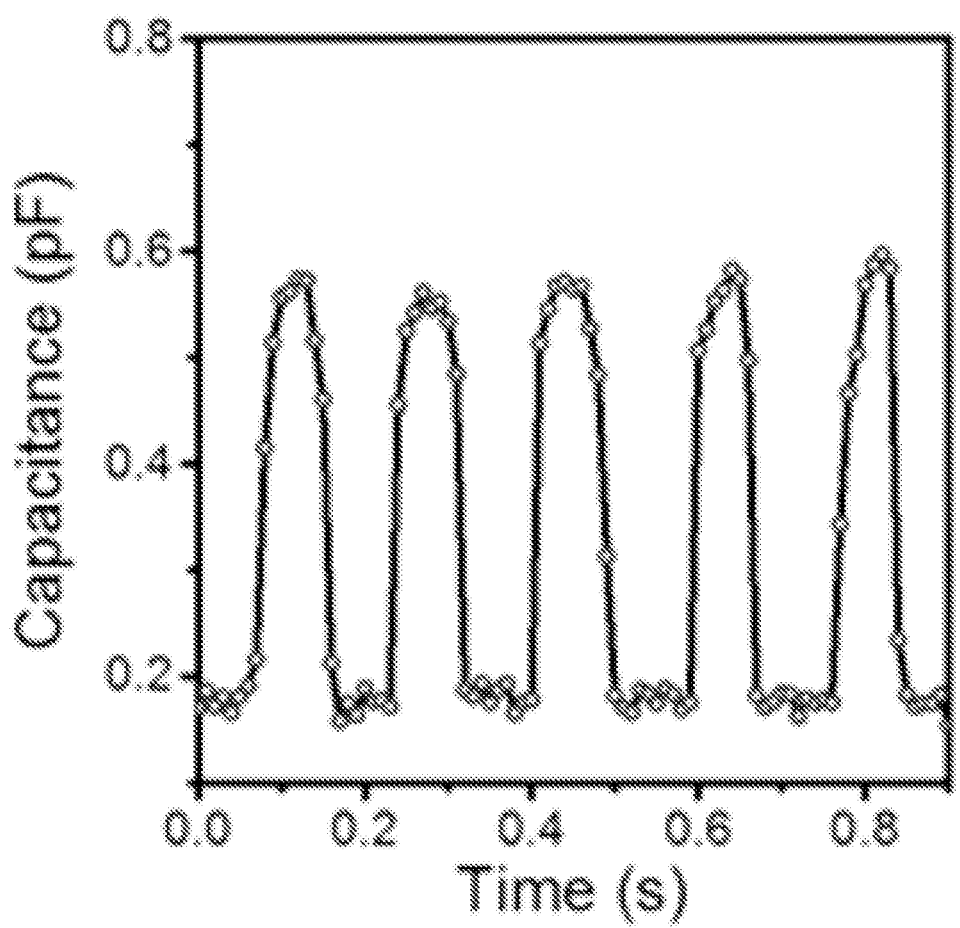
FIG. 8B is a plot of capacitance (in picofarads or pF) as a function of time (in seconds or s) showing the capacitance change of the touch sensor according to various embodiments when the finger is in contact with the sensor surface and when the finger is not in contact with the sensor surface.

The touch sensing performance of the sensor array may be evaluated under different stretching strains on a customized stretching stage. The capacitance changes of an elastic touch sensor under finger touch may be recorded when the sensor array is under different stretching strains. FIG. 8B is a plot of capacitance (in picofarads or pF) as a function of time (in seconds or s) showing the capacitance change of the touch sensor according to various embodiments when the finger is in contact with the sensor surface and when the finger is not in contact with the sensor surface.

The toughs of FIG. 8B represent a "relaxed" state in which the finger is not in contact with the touch sensor, while the peaks represent a "touch" state in which the finger is in contact with the touch sensor. The sensor may respond almost promptly to the finger touch, i.e. with a response time of ~20 ms. After the finger is removed from the sensor surface, the capacitance may be recovered within ~20 ms.

Figure 8C:
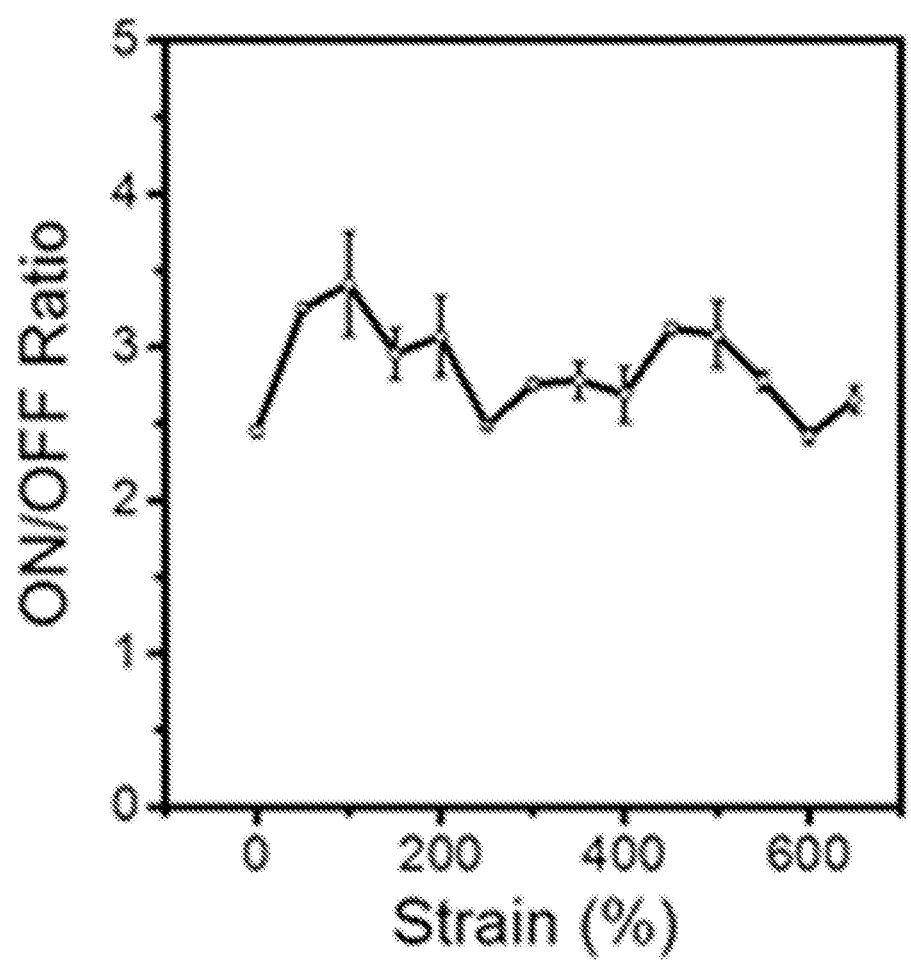
FIG. 8C is a plot of ON/OFF ratio as a function of strain (in percent or %) showing the ON/OFF ratio of the touch sensor according to various embodiments under different stretching states.

A ON/OFF ratio may be defined as $C_T/C_0$, where $C_T$ is the capacitance of the sensor upon touch and $C_0$ is the capacitance without touch, i.e. the finger is not in contact with the sensor. FIG. 8C is a plot of ON/OFF ratio as a function of strain (in percent or %) showing the ON/OFF ratio of the touch sensor according to various embodiments under different stretching states.

As shown in FIG. 8C, the ON/OFF ratio of the touch sensor may vary with stretching, which may be attributed to the variation in the self-capacitance value of the sensor without touch. The ON/OFF ratio may be maintained between a range of 2.5 to 3.5 with a stretching strain of up to 650%.

An advantage of the 3D printing or the direct ink writing approach is the capability of freeform generation of active electronic components.

The combination of stretchability and capability of direct ink writing approach may allow fabrication of three-dimensional touch sensing capabilities on arbitrary surfaces. As a demonstration, a 3-pixel touch sensing array may be designed and formed on a curvilinear surface of a 20 ml glass bottle with a diameter of 13.5 mm.

Figure 9A:
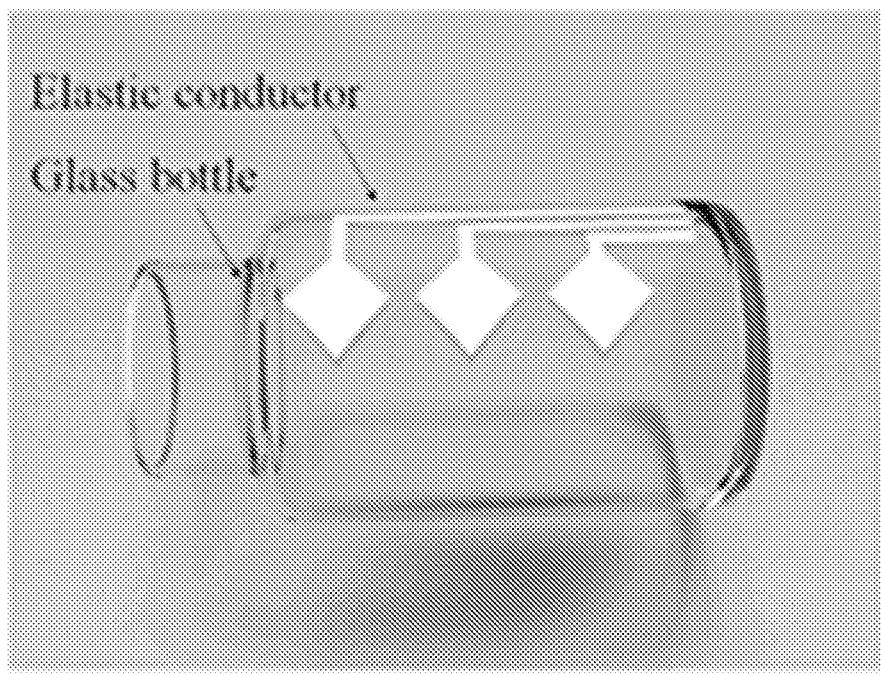
FIG. 9A is a schematic showing a three-dimensional (3D) design of the touch sensor array according to various embodiments on a glass bottle.
Figure 9B:
FIG. 9B shows a photo of the touch sensor array according to various embodiments on the glass bottle.

FIG. 9A is a schematic showing a three-dimensional (3D) design of the touch sensing array according to various embodiments on a glass bottle. FIG. 9B shows a photo of the touch sensing array according to various embodiments on the glass bottle.

Figure 9C:
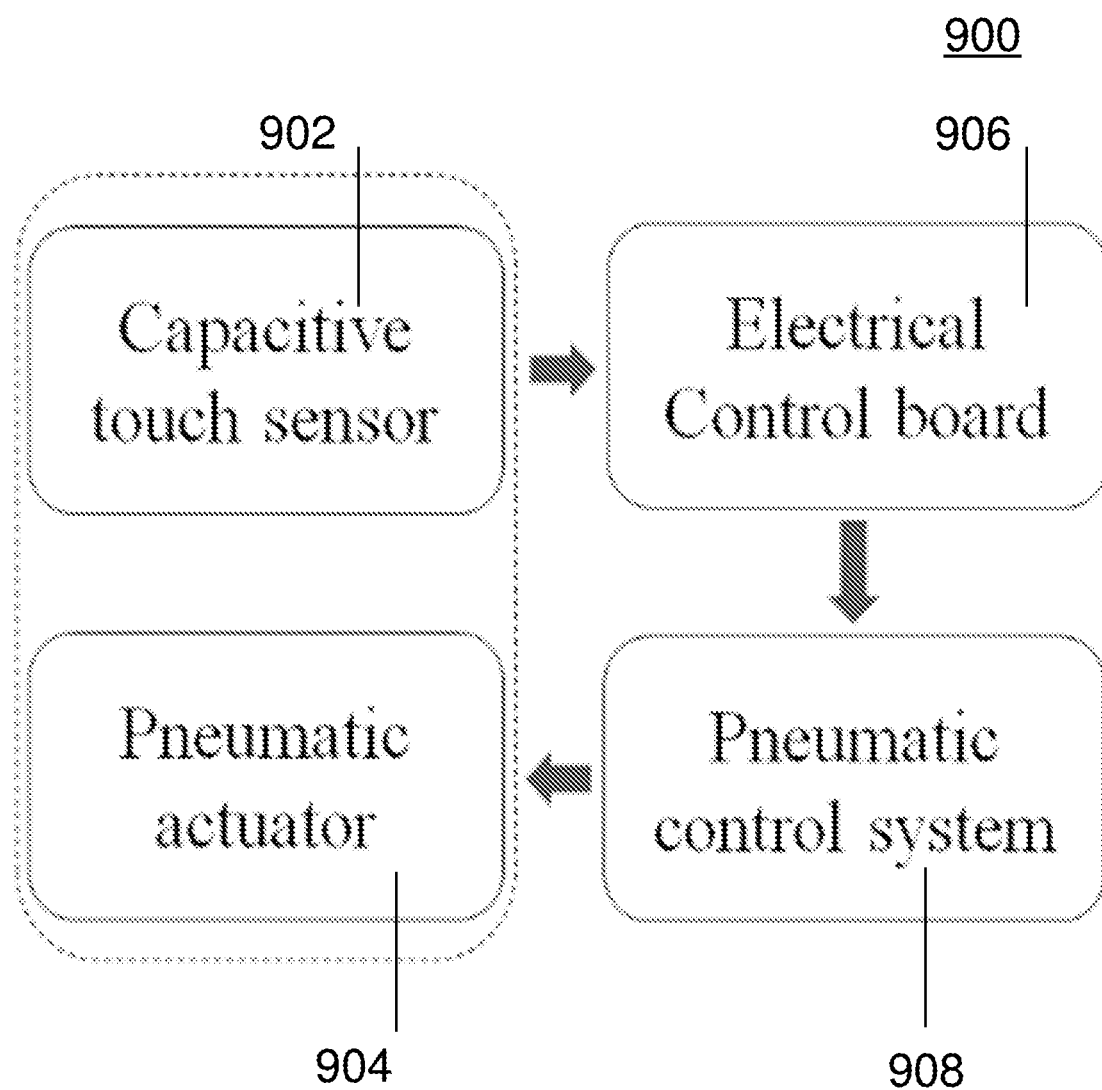
FIG. 9C is a schematic illustrating a touching sensing system including a touch sensor according to various embodiments.

FIG. 9C is a schematic illustrating a touching sensing system 900 including a touch sensor 902 according to various embodiments. The system 900 may further include a pneumatic actuator 904, an electrical control board 906, and a pneumatic control system 908 (also referred to as a pressure controller).

The touch sensor 902 may be assembled or formed on or over the pneumatic actuator 904 as an integrated device providing the capabilities of touch sensing and mechanical actuation. The electrical control board 906 and the pneumatic control system 908 may serve as the external control system. The touch sensor 902 may be coupled or connected to the electrical control board 906, the electrical control board 906 may be coupled or connected to the pneumatic control system 908, and the pneumatic control system 908 may be coupled or connected pneumatic actuator 904.

Figure 9D:
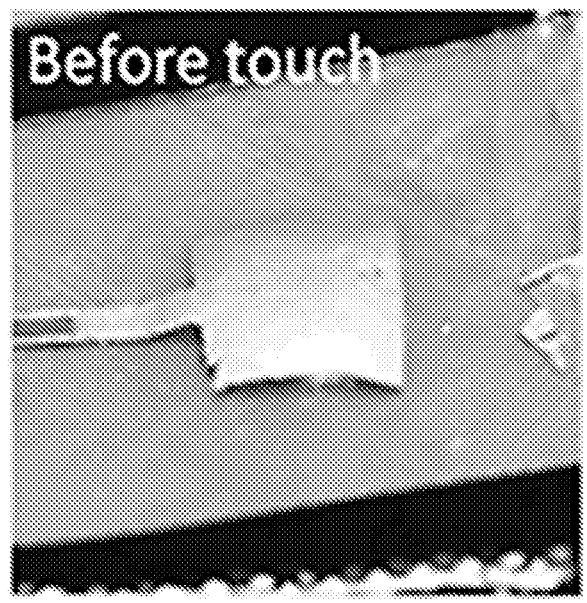
FIG. 9D shows an image of an interactive touch sensor according to various embodiments before being depressed.
Figure 9E:
FIG. 9E shows an image of the interactive touch sensor as shown in FIG. 9D according to various embodiment being in contact with a human finger.

The capacitance change of the touch sensor 902 may be sensed or measured by the electrical control board 906, which may communicate with the pressure controller 908 via a designed program. The pressure controller 908 may provide pressure to the pneumatic actuator 904 upon receiving a signal from the control board 906, thus providing displacement to the actuator 904 to achieve tactile feedback. Based on the designed program, the actuator 904 may provide different tactile feedback to the user, such as raising a vertical protrusion or depressing the protrusion depending on whether the sensor 902 detects an object, e.g. a human finger. The protrusions may range from 1-2 cm. FIG. 9D shows an image of an interactive touch sensor according to various embodiments before being depressed. FIG. 9E shows an image of the interactive touch sensor as shown in FIG. 9D according to various embodiment being in contact with a human finger.

The control program may be designed such that when the contact is detected by the touch sensor, the pneumatic actuator 904 may be pressurized to provide vertical displacement. The actuator 904 may be released when contact is no longer detected.

Light-emitting diodes (LEDs) are important electronic components for lighting and display applications. As the LED emission is based on charge injection-recombination process, a large current flow may be required for the LEDs operation (typically >20 $mA/cm^2$). Stable resistance of the elastic conductor may be critical to achieve consistent operation in the stretchable LED systems.

Prior works have established the approaches to achieve stretchable LED systems by assembling LEDs with serpentine metal interconnects included in thin film structures on elastic substrates. The formation of serpentine metal interconnects may require complicated and delicate photolithography and transferring processes. As such, the formation of the serpentine metal interconnects may be difficult for large-scale electronic systems.

Elastic conductors with excellent stretchability and stable conductivity may be a promising candidate as a substitute for serpentine metal interconnects, as the elastic conductors may be able to address the various challenges faced by serpentine metal interconnects.

Light emitting diode (LED) arrays including the elastic conductor has been fabricated.

Printed elastic conductors (width×length=5×15 mm) may be used as elastic wires to connect to a strip of LEDs (number of the LEDs is 198) to form the LED array. The elastic conductors may be stretched to a strain of 600%.

Figure 10A:
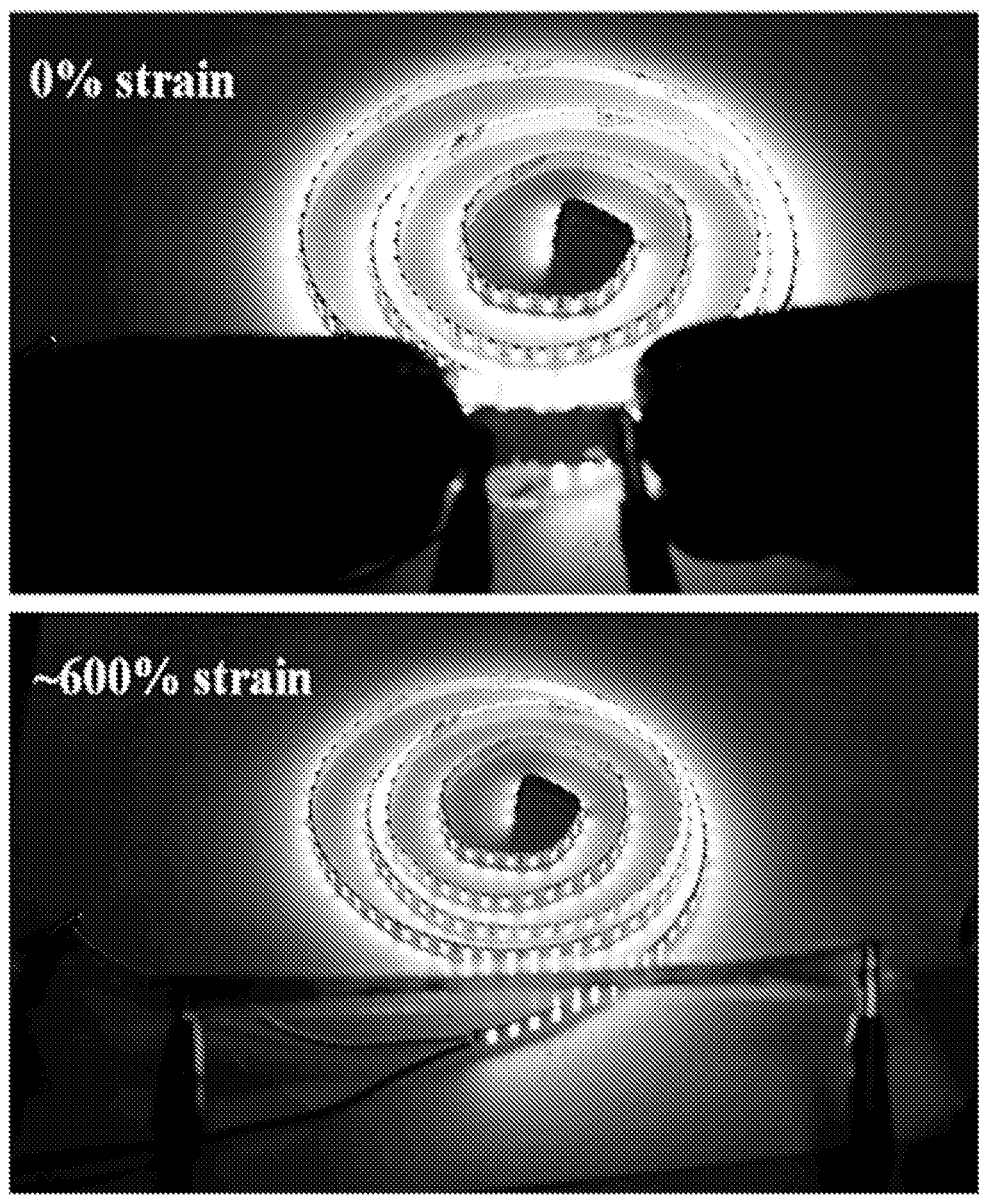
FIG. 10A shows (above) an image of an unstretched light emitting diode strip according to various embodiments; and (below) an image of the light emitting diode strip according to various embodiments in which the elastic conductor is stretched to about 600% strain.

FIG. 10A shows (above) an image of an unstretched light emitting diode strip according to various embodiments; and (below) an image of the light emitting diode strip according to various embodiments in which the elastic conductor is stretched to about 600% strain. FIG. 10A shows that the LEDs may be maintained in the "on" state when the elastic wires are unstretched and when the elastic wires are stretched to a high strain of about 600%.

Figure 10B:
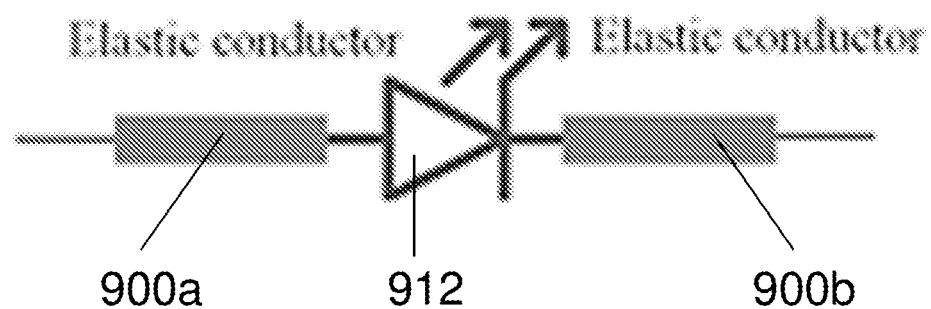
FIG. 10B is a schematic showing a light emitting diode with a first end connected with a first elastic conductor and a second end connected with a second elastic conductor according to various embodiments.

The LED strip may maintain bright emission even under the extremely high stretching strains (the driving current of the LED strip has been fixed at a constant value). Subsequently, the elastic conductor may be used to connect individual LED components to form a stretchable LED array including elastic conductors connecting individual LEDs. FIG. 10B is a schematic showing a light emitting diode 912 with a first end connected with a first elastic conductor 900a and a second end connected with a second elastic conductor 900b according to various embodiments.

Figure 10C:
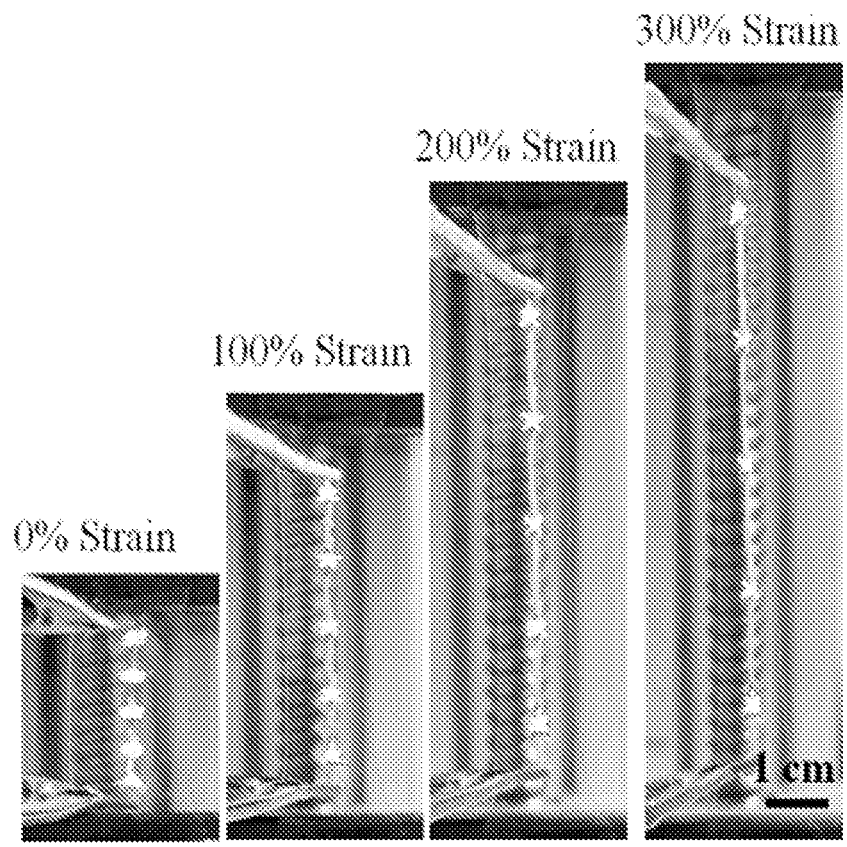
FIG. 10C shows images of light emitting arrays including light emitting diodes connected with elastic conductors according to various embodiments being stretched up to a strain of about 300%.

The LED array may be stretched up to 300% with well-maintained device functionality. FIG. 10C shows images of light emitting arrays including light emitting diodes connected with elastic conductors according to various embodiments being stretched up to a strain of about 300%.

Stretching beyond 300% strain may cause unstable emission behavior in the LED arrays. The limitation on the stretchability may be due to the contact problem between the elastic conductor and the LED devices under high strains. The rigid LED structure may create high localized strains at the contact area, leading to connection failure under high stretching strains. Utilizing an over-coating layer to improve the anchoring of the LEDs to the elastic substrate or reducing the size of the LEDs may help to further increase the stretchability of the LED arrays. Nevertheless, the achieved stretchable LED system may demonstrate the best stretchability among the reported results using printable conductors.

The printable and superelastic conductor may be achieved with a simply fabrication approach. With the "friendly"

deposition process, the superelastic conductor may be easily applied to a wide range of soft and stretchable electronic applications such as stretchable sensors, actuators, displays, field-effect transistors, and power generators etc. The development of the printable and superelastic conductors may open new avenues for the advancement of soft, active, and interactive human-machine interfaces.

Experimental Details

Printable Elastic Conductor Preparation

EVA (DuPont, Elvax® 40W), chlorobenzene (Sigma-Aldrich, anhydrous, 99.8%), acrylic acid (Sigma-Aldrich, anhydrous, 99%), silver flakes (Sigma-Aldrich, flakes, 10 μm, ≤99% trace metals basis), and silicone rubber (Smooth-On, Ecoflex® 00-30) were purchased and used as received. The EVA was dissolved in chlorobenzene. The weight ratio of EVA to chlorobenzene was fixed at 1:6 in this report unless stated otherwise. The EGaIn alloy was prepared with different weight in a 4 ml bottle with 2500 mg of acetone. The EGaIn alloy in acetone was sonicated for 30 mins in a MRC AC-200H sonicator. The weight ratios of Ag flakes, acrylic acid, and EGaInPs to the EVA solution were adjusted in the composites to optimize the stretchability and conductivity. The conductive inks with different weight ratios of the compositions were thoroughly mixed with a vortex mixer (Dragonlab, MX-S).

Printing Of Elastic Conductor

The elastic inks were printed via a customized printer based on a 3D printer (Ultimaker 2). The printing paths were designed and generated by the computer numerical control (CNC) software (Mastercam). The G-code, which was used to control the XYZ motion of the printer, was generated based on the designed printing paths. Due to the fast evaporation rate of chlorobenzene, the inks were dried within half a minute after printed onto the substrate under room temperature. All the printing processes were carried out in a fume hood.

Fabrication of Interactive Touch Sensor and Stretchable LED Arrays

The touch sensor was firstly fabricated by printing a sensing pad with the elastic conductor on the elastic substrates such as 3M VHB tape by the 3D printer. The interactive device was fabricated by attaching the printed touch sensor onto a rigid gas chamber (fabricated by a commercial 3D printer). The touch sensor was connected to the electrical control board comprising a capacitance measuring module and an open-source microcontroller (Arduino® UNO). The microcontroller was programmed to communicate with the pressure controller which was used to pressurize or release the pneumatic actuator.

The stretchable LED arrays were fabricated by assembling the commercial LEDs (length×width=2.0×1.25 mm) on to a 3M VHB tape. The LEDs were pressed and boned to the adhesive surface of the VHB tape. The elastic electrical interconnects were directly printed by a 3D printer with designed printing path. Additional conductive ink was applied at the contact pads of the LEDs with the printed elastic interconnects.

Characterization and Testing of the Elastic Conductor

Sheet resistance of the elastic conductor was measured by the 4-point probe method. Thickness of the elastic conductor was measured by a surface profiler. The elastic conductors were stretched by a home-made stretching stage. The resistances of the elastic conductor under different stretching states were measured by a Keithley 2400 source meter. The capacitances of the touch sensor were measured by a precision LCR meter (Agilent E4980A). The morphology of the printed elastic conductor was characterized by a field-emission SEM (FE-SEM, JSM 7600F).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An elastic conductor comprising:
a matrix comprising a matrix material;
a plurality of electrically conductive structures embedded in the matrix; and
one or more particles embedded in the matrix,
wherein each particle of the one or more particles comprises a core of an electrically conductive material and an outer shell surrounding the core such that each particle of the one or more particles is configured to release the electrically conductive material when the outer shell breaks or deforms upon stretching of the elastic conductor.

2. The elastic conductor according to claim 1, wherein the electrically conductive material released electrically connects a first electrically conductive structure and a second electrically conductive structure of the plurality of electrically conductive structures.

3. The elastic conductor according to claim 1, wherein the electrically conductive material comprises an alloy of indium and gallium.

4. The elastic conductor according to claim 3, wherein the electrically conductive material is eutectic gallium indium; and wherein the outer shell is gallium oxide.

5. The elastic conductor according to claim 1, wherein the electrically conductive material comprises an alloy of indium, gallium and tin.

6. The elastic conductor according to claim 1, wherein the electrically conductive material comprises an alloy of indium, gallium and zinc.

7. The elastic conductor according to claim 1, wherein the matrix further comprises an additive.

8. The elastic conductor according to claim 7, wherein the additive is acrylic acid.

9. The elastic conductor according to claim 1, wherein the electrically conductive structures are any one type of structure selected from a group consisting of flakes, nanoparticles, nanotubes, and nanowires.

10. The elastic conductor according to claim 1, wherein the plurality of electrically conductive structures comprises silver, gold, or carbon.

11. The elastic conductor according to claim 1, wherein the matrix material is any one polymer selected from a group consisting of ethylene vinyl acetate (EVA), (hydroxypropyl) methyl cellulose, and poly(styrene-butadiene-styrene) rubber.

12. The elastic conductor according to claim 1, wherein the matrix material is a fluorine rubber.

13. A device comprising an elastic conductor, wherein the elastic conductor comprises:
a matrix comprising a matrix material;
a plurality of electrically conductive structures embedded in the matrix; and
one or more particles embedded in the matrix,
wherein each particle of the one or more particles comprises a core of an electrically conductive material and an outer shell surrounding the core such that each particle of the one or more particles is configured to release the electrically conductive material when the outer shell breaks or deforms upon stretching of the elastic conductor.

14. A method of forming an elastic conductor, the method comprising:
   forming a matrix comprising a matrix material, and a plurality of electrically conductive structures and one or more particles embedded in the matrix
   wherein each particle of the one or more particles comprises a core of an electrically conductive material and an outer shell surrounding the core such that each particle of the one or more particles is configured to release the electrically conductive material when the outer shell breaks or deforms upon stretching of the elastic conductor.

15. The method according to claim 14, wherein forming the matrix comprises forming a composition comprising the matrix material, the plurality of electrically conductive structures, the one or more particles, and a solvent.

16. The method according to claim 15, further comprising:
   depositing the composition on a substrate;
   wherein the solvent evaporates from the deposited composition, thereby forming the elastic conductor.

17. The method according to claim 16, wherein the composition is deposited on the substrate by three-dimensional printing.

18. The method according to claim 14, wherein the matrix further comprises an additive.

* * * * *